United States Patent
Im et al.

(10) Patent No.: US 9,087,696 B2
(45) Date of Patent: *Jul. 21, 2015

(54) SYSTEMS AND METHODS FOR NON-PERIODIC PULSE PARTIAL MELT FILM PROCESSING

(75) Inventors: James S. Im, New York, NY (US); Yikang Deng, New York, NY (US); Qiongying Hu, New York, NY (US); Ui-Jin Chung, Rego Park, NY (US); Alexander B. Limanov, Millburn, NJ (US)

(73) Assignee: THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 382 days.

This patent is subject to a terminal disclaimer.

(21) Appl. No.: 13/505,961

(22) PCT Filed: Nov. 2, 2010

(86) PCT No.: PCT/US2010/055106
§ 371 (c)(1),
(2), (4) Date: Dec. 6, 2012

(87) PCT Pub. No.: WO2011/056787
PCT Pub. Date: May 12, 2011

(65) Prior Publication Data
US 2013/0105807 A1 May 2, 2013

Related U.S. Application Data

(63) Continuation of application No. 12/776,756, filed on May 10, 2010, now Pat. No. 8,440,581, which is a continuation of application No. PCT/US2010/033565, filed on May 4, 2010.

(Continued)

(51) Int. Cl.
*H01L 21/20* (2006.01)
*H01L 21/02* (2006.01)
(Continued)

(52) U.S. Cl.
CPC ...... *H01L 21/02686* (2013.01); *B23K 26/0081* (2013.01); *H01L 21/0268* (2013.01);
(Continued)

(58) Field of Classification Search
CPC .............. H01L 21/02686; H01L 27/1285; H01L 21/2026; H01L 29/78675; H01L 29/78678
USPC ................. 438/486, 487, 795; 257/E21.134, 257/E21.347
See application file for complete search history.

(56) References Cited

U.S. PATENT DOCUMENTS 3,632,205 A  1/1972  Marcy et al.
4,234,358 A  11/1980 Celler et al.
(Continued)

FOREIGN PATENT DOCUMENTS

CN  1495848 A  5/2004
CN  101111925 A  1/2008
(Continued)

OTHER PUBLICATIONS

Andrä et al., "A new technology for crystalline silicon thin film solar cells on glass based on the laser crystallization," IEEE, pp. 217-220 (2000).
(Continued)

*Primary Examiner* — Minh-Loan Tran
(74) *Attorney, Agent, or Firm* — Wilmer Cutler Pickering; Hale and Dorr LLP

(57) ABSTRACT

In one aspect, the present disclosure relates to a method of processing a thin film including, while advancing a thin film in a first selected direction, irradiating a first region of the thin film with a first laser pulse and a second laser pulse, each laser pulse providing a shaped beam and having a fluence that is sufficient to partially melt the thin film and the first region re-solidifying and crystallizing to form a first crystallized region, and irradiating a second region of the thin film with a third laser pulse and a fourth laser pulse, each pulse providing a shaped beam and having a fluence that is sufficient to partially melt the thin film and the second region re-solidifying and crystallizing to form a second crystallized region, wherein the time interval between the first laser pulse and the second laser pulse is less than half the time interval between the first laser pulse and the third laser pulse.

27 Claims, 15 Drawing Sheets

Related U.S. Application Data

(60) Provisional application No. 61/257,657, filed on Nov. 3, 2009, provisional application No. 61/257,650, filed on Nov. 3, 2009, provisional application No. 61/264,082, filed on Nov. 24, 2009, provisional application No. 61/286,643, filed on Dec. 15, 2009, provisional application No. 61/291,663, filed on Dec. 31, 2009, provisional application No. 61/291,488, filed on Dec. 31, 2009, provisional application No. 61/294,288, filed on Jan. 12, 2010.

(51) Int. Cl.
*H01L 29/04* (2006.01)
*H01L 21/67* (2006.01)
*H01L 29/786* (2006.01)
*B23K 26/00* (2014.01)
*H01L 21/268* (2006.01)
*H01L 27/12* (2006.01)

(52) U.S. Cl.
CPC ........ *H01L21/02691* (2013.01); *H01L 21/268* (2013.01); *H01L 21/67115* (2013.01); *H01L 27/1285* (2013.01); *H01L 27/1296* (2013.01); *H01L 29/04* (2013.01); *H01L 29/78678* (2013.01); *B23K 2201/40* (2013.01); *H01L 21/02532* (2013.01)

(56) References Cited

U.S. PATENT DOCUMENTS

| | | |
|---|---|---|
| 4,309,225 A | 1/1982 | Fan et al. |
| 4,382,658 A | 5/1983 | Shields et al. |
| 4,456,371 A | 6/1984 | Lin |
| 4,639,277 A | 1/1987 | Hawkins |
| 4,691,983 A | 9/1987 | Kobayashi et al. |
| 4,727,047 A | 2/1988 | Bozler et al. |
| 4,758,533 A | 7/1988 | Magee et al. |
| 4,793,694 A | 12/1988 | Liu |
| 4,800,179 A | 1/1989 | Mukai et al. |
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,977,104 A | 12/1990 | Sawada et al. |
| 5,032,233 A | 7/1991 | Yu et al. |
| 5,061,655 A | 10/1991 | Ipposhi et al. |
| 5,076,667 A | 12/1991 | Stewart |
| RE33,836 E | 3/1992 | Resor, III et al. |
| 5,145,808 A | 9/1992 | Sameshima et al. |
| 5,173,441 A | 12/1992 | Yu et al. |
| 5,204,659 A | 4/1993 | Sarma |
| 5,233,207 A | 8/1993 | Anzai et al. |
| 5,247,375 A | 9/1993 | Mochizuki |
| 5,281,840 A | 1/1994 | Sarma |
| 5,285,236 A | 2/1994 | Jain |
| 5,291,240 A | 3/1994 | Jain |
| 5,294,811 A | 3/1994 | Aoyama et al. |
| 5,304,357 A | 4/1994 | Sato et al. |
| 5,338,959 A | 8/1994 | Kim et al. |
| 5,373,803 A | 12/1994 | Noguchi et al. |
| 5,395,481 A | 3/1995 | McCarthy |
| 5,409,867 A | 4/1995 | Asano et al. |
| 5,453,594 A | 9/1995 | Konecny |
| 5,456,763 A | 10/1995 | Kaschmitter et al. |
| 5,486,237 A | 1/1996 | Sano et al. |
| 5,496,768 A | 3/1996 | Kudo et al. |
| 5,512,494 A | 4/1996 | Tanabe et al. |
| 5,523,193 A | 6/1996 | Nelson |
| 5,529,951 A | 6/1996 | Noguchi et al. |
| 5,591,668 A | 1/1997 | Maegawa et al. |
| 5,663,579 A | 9/1997 | Noguchi |
| 5,683,935 A | 11/1997 | Miyamoto |
| 5,710,050 A | 1/1998 | Makita et al. |
| 5,721,606 A | 2/1998 | Jain |
| 5,742,426 A | 4/1998 | York |
| 5,756,364 A | 5/1998 | Tanaka et al. |
| 5,766,989 A | 6/1998 | Maegawa et al. |
| 5,767,003 A | 6/1998 | Noguchi |
| 5,817,548 A | 10/1998 | Noguchi et al. |
| 5,844,588 A | 12/1998 | Anderson |
| 5,858,807 A | 1/1999 | Kawamura |
| 5,861,991 A | 1/1999 | Fork |
| 5,893,990 A | 4/1999 | Tanaka et al. |
| 5,960,323 A | 9/1999 | Wakita et al. |
| 5,986,807 A | 11/1999 | Fork |
| 6,002,523 A | 12/1999 | Tanaka |
| 6,014,944 A | 1/2000 | Aklufi et al. |
| 6,020,244 A | 2/2000 | Thompson et al. |
| 6,045,980 A | 4/2000 | Edelkind et al. |
| 6,072,631 A | 6/2000 | Guenther et al. |
| 6,081,381 A | 6/2000 | Shalapenok et al. |
| 6,117,752 A | 9/2000 | Suzuki et al. |
| 6,120,976 A | 9/2000 | Treadwell et al. |
| 6,130,009 A | 10/2000 | Smith et al. |
| 6,130,455 A | 10/2000 | Yoshinouchi et al. |
| 6,136,632 A | 10/2000 | Higashi |
| 6,156,997 A | 12/2000 | Yamazaki et al. |
| 6,162,711 A | 12/2000 | Ma et al. |
| 6,169,014 B1 | 1/2001 | McCulloch et al. |
| 6,172,820 B1 | 1/2001 | Kuwahara et al. |
| 6,176,922 B1 | 1/2001 | Aklufi et al. |
| 6,177,301 B1 | 1/2001 | Jung et al. |
| 6,187,088 B1 | 2/2001 | Okumura et al. |
| 6,190,985 B1 | 2/2001 | Buynoski |
| 6,193,796 B1 | 2/2001 | Yang et al. |
| 6,203,952 B1 | 3/2001 | O'Brien et al. |
| 6,235,614 B1 | 5/2001 | Yang et al. |
| 6,242,291 B1 | 6/2001 | Kusumoto et al. |
| 6,274,488 B1 | 8/2001 | Talwar et al. |
| 6,285,001 B1 | 9/2001 | Fleming et al. |
| 6,300,175 B1 | 10/2001 | Moon et al. |
| 6,313,435 B1 | 11/2001 | Shoemaker et al. |
| 6,316,338 B1 | 11/2001 | Jung et al. |
| 6,320,227 B1 | 11/2001 | Lee et al. |
| 6,322,625 B2 | 11/2001 | Im |
| 6,326,186 B1 | 12/2001 | Kirk et al. |
| 6,326,215 B1 | 12/2001 | Keen |
| 6,326,286 B1 | 12/2001 | Park et al. |
| 6,333,232 B1 | 12/2001 | Kunikiyo et al. |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka et al. |
| 6,393,042 B1 | 5/2002 | Tanaka et al. |
| 6,407,012 B1 | 6/2002 | Miyasaka et al. |
| 6,410,373 B1 | 6/2002 | Chang et al. |
| 6,429,100 B2 | 8/2002 | Yoneda et al. |
| 6,432,758 B1 | 8/2002 | Cheng et al. |
| 6,437,284 B1 | 8/2002 | Okamoto et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,479,837 B1 | 11/2002 | Ogawa et al. |
| 6,482,722 B2 | 11/2002 | Kunii et al. |
| 6,493,042 B1 | 12/2002 | Bozdagi et al. |
| 6,495,067 B1 | 12/2002 | Ono et al. |
| 6,495,405 B2 | 12/2002 | Voutsas et al. |
| 6,501,095 B2 | 12/2002 | Yamaguchi et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka et al. |
| 6,516,009 B1 | 2/2003 | Tanaka et al. |

(56) References Cited

U.S. PATENT DOCUMENTS

| | | |
|---|---|---|
| 6,521,492 B2 | 2/2003 | Miyasaka et al. |
| 6,526,585 B1 | 3/2003 | Hill |
| 6,528,359 B2 | 3/2003 | Kusumoto et al. |
| 6,531,681 B1 | 3/2003 | Markle et al. |
| 6,535,535 B1 | 3/2003 | Yamazaki et al. |
| 6,555,422 B1 | 4/2003 | Yamazaki et al. |
| 6,555,449 B1 | 4/2003 | Im et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Sposili et al. |
| 6,582,827 B1 | 6/2003 | Im |
| 6,590,228 B2 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,741,621 B2 | 5/2004 | Asano |
| 6,750,424 B2 | 6/2004 | Tanaka |
| 6,755,909 B2 | 6/2004 | Jung |
| 6,784,455 B2 | 8/2004 | Maekawa et al. |
| 6,830,993 B1 | 12/2004 | Im et al. |
| 6,858,477 B2 | 2/2005 | Deane et al. |
| 6,908,835 B2 | 6/2005 | Sposili et al. |
| 6,916,690 B2 | 7/2005 | Chang |
| 6,961,117 B2 | 11/2005 | Im |
| 6,962,860 B2 | 11/2005 | Yamazaki et al. |
| 6,984,573 B2 | 1/2006 | Yamazaki et al. |
| 7,029,996 B2 | 4/2006 | Im et al. |
| 7,078,281 B2 | 7/2006 | Tanaka et al. |
| 7,078,793 B2 | 7/2006 | Ruckerbauer et al. |
| 7,091,411 B2 | 8/2006 | Falk et al. |
| 7,115,503 B2 | 10/2006 | Im |
| 7,119,365 B2 | 10/2006 | Takafuji et al. |
| 7,132,204 B2 | 11/2006 | Jung |
| 7,144,793 B2 | 12/2006 | Gosain et al. |
| 7,164,152 B2 | 1/2007 | Im |
| 7,183,229 B2 | 2/2007 | Yamanaka |
| 7,187,016 B2 | 3/2007 | Arima |
| 7,189,624 B2 | 3/2007 | Ito |
| 7,192,479 B2 | 3/2007 | Mitani et al. |
| 7,192,818 B1 | 3/2007 | Lee et al. |
| 7,199,397 B2 | 4/2007 | Huang et al. |
| 7,217,605 B2 | 5/2007 | Kawasaki et al. |
| 7,297,982 B2 | 11/2007 | Suzuki et al. |
| 7,311,778 B2 | 12/2007 | Im et al. |
| 7,318,866 B2 | 1/2008 | Im |
| 7,326,876 B2 | 2/2008 | Jung |
| 7,364,952 B2 | 4/2008 | Im |
| 7,399,359 B2 | 7/2008 | Im et al. |
| 7,645,337 B2 | 1/2010 | Im et al. |
| 7,700,462 B2 | 4/2010 | Tanaka et al. |
| 7,804,647 B2 | 9/2010 | Mitani et al. |
| 8,440,581 B2 * | 5/2013 | Im et al. .................. 438/795 |
| 2001/0001745 A1 | 5/2001 | Im et al. |
| 2001/0029089 A1 | 10/2001 | Tanaka |
| 2001/0030292 A1 | 10/2001 | Brotherton |
| 2001/0041426 A1 | 11/2001 | Im |
| 2002/0083557 A1 | 7/2002 | Jung |
| 2002/0104750 A1 | 8/2002 | Ito |
| 2002/0119609 A1 | 8/2002 | Hatano et al. |
| 2002/0151115 A1 | 10/2002 | Nakajima et al. |
| 2002/0197778 A1 | 12/2002 | Kasahara et al. |
| 2003/0000455 A1 | 1/2003 | Voutsas |
| 2003/0006221 A1 | 1/2003 | Hong et al. |
| 2003/0013278 A1 | 1/2003 | Jang et al. |
| 2003/0013280 A1 | 1/2003 | Yamanaka |
| 2003/0022471 A1 | 1/2003 | Taketomi et al. |
| 2003/0029212 A1 | 2/2003 | Im |
| 2003/0057418 A1 | 3/2003 | Asano |
| 2003/0060026 A1 | 3/2003 | Yamazaki et al. |
| 2003/0068836 A1 | 4/2003 | Hongo et al. |
| 2003/0088848 A1 | 5/2003 | Crowder |
| 2003/0096489 A1 | 5/2003 | Im et al. |
| 2003/0104682 A1 | 6/2003 | Hara |
| 2003/0119286 A1 | 6/2003 | Im et al. |
| 2003/0148565 A1 | 8/2003 | Yamanaka |
| 2003/0148594 A1 | 8/2003 | Yamazaki et al. |
| 2003/0183270 A1 | 10/2003 | Falk et al. |
| 2003/0194613 A1 | 10/2003 | Voutsas et al. |
| 2003/0196589 A1 | 10/2003 | Mitani et al. |
| 2003/0218171 A1 | 11/2003 | Isobe et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0209447 A1 | 10/2004 | Gosain et al. |
| 2004/0222187 A1 | 11/2004 | Lin |
| 2004/0224487 A1 | 11/2004 | Yang |
| 2005/0003591 A1 | 1/2005 | Takaoka et al. |
| 2005/0032249 A1 | 2/2005 | Im et al. |
| 2005/0034653 A1 | 2/2005 | Im et al. |
| 2005/0059222 A1 | 3/2005 | You |
| 2005/0059224 A1 | 3/2005 | Im |
| 2005/0059265 A1 | 3/2005 | Im |
| 2005/0112906 A1 | 5/2005 | Maekawa et al. |
| 2005/0139830 A1 | 6/2005 | Takeda et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2005/0235903 A1 | 10/2005 | Im et al. |
| 2005/0255640 A1 | 11/2005 | Im et al. |
| 2006/0030164 A1 | 2/2006 | Im |
| 2006/0035478 A1 | 2/2006 | You |
| 2006/0040512 A1 | 2/2006 | Im |
| 2006/0060130 A1 | 3/2006 | Im |
| 2006/0102901 A1 | 5/2006 | Im et al. |
| 2006/0125741 A1 | 6/2006 | Tanaka et al. |
| 2006/0134890 A1 | 6/2006 | Im |
| 2006/0211183 A1 | 9/2006 | Duan et al. |
| 2006/0254500 A1 | 11/2006 | Im et al. |
| 2007/0007242 A1 | 1/2007 | Im |
| 2007/0010074 A1 | 1/2007 | Im |
| 2007/0010104 A1 | 1/2007 | Im |
| 2007/0012664 A1 | 1/2007 | Im |
| 2007/0020942 A1 | 1/2007 | Im |
| 2007/0032096 A1 | 2/2007 | Im |
| 2007/0051302 A1 | 3/2007 | Gosain et al. |
| 2007/0054477 A1 | 3/2007 | Kim et al. |
| 2007/0108472 A1 | 5/2007 | Jeong et al. |
| 2007/0111349 A1 | 5/2007 | Im |
| 2007/0145017 A1 | 6/2007 | Im et al. |
| 2007/0184638 A1 | 8/2007 | Kang et al. |
| 2007/0215877 A1 | 9/2007 | Kato et al. |
| 2007/0215942 A1 | 9/2007 | Chen et al. |
| 2008/0035863 A1 | 2/2008 | Im et al. |
| 2008/0124526 A1 | 5/2008 | Im |
| 2008/0176414 A1 | 7/2008 | Im |
| 2009/0078940 A1 | 3/2009 | Afentakis et al. |
| 2009/0121157 A1 | 5/2009 | Moffatt et al. |
| 2009/0137105 A1 | 5/2009 | Im |
| 2009/0242805 A1 | 10/2009 | Im |
| 2009/0309104 A1 | 12/2009 | Im et al. |
| 2010/0024865 A1 | 2/2010 | Shah et al. |

FOREIGN PATENT DOCUMENTS

| | | |
|---|---|---|
| DE | 19839718 | 3/2000 |
| DE | 10103670 A1 | 8/2002 |
| DE | 102007025942 A1 | 12/2008 |
| EP | 655774 A2 | 5/1995 |
| EP | 681316 A2 | 11/1995 |
| EP | 1067593 A2 | 1/2001 |
| GB | 2338342 A | 12/1999 |
| GB | 2338343 A | 12/1999 |
| GB | 2338597 A | 12/1999 |
| JP | S57-027035 | 2/1982 |

(56) References Cited

FOREIGN PATENT DOCUMENTS

| | | |
|---|---|---|
| JP | 62160781 | 7/1987 |
| JP | 62181419 A | 8/1987 |
| JP | 62216320 | 9/1987 |
| JP | H01-256114 | 10/1989 |
| JP | 2081422 | 3/1990 |
| JP | 2283036 A | 11/1990 |
| JP | 04033327 A | 2/1992 |
| JP | 04-279064 | 10/1992 |
| JP | H04-282869 | 10/1992 |
| JP | 5041519 A | 2/1993 |
| JP | 5048190 | 2/1993 |
| JP | 406011729 | 1/1994 |
| JP | 6252048 A | 9/1994 |
| JP | H06-260502 | 9/1994 |
| JP | 6283422 A | 10/1994 |
| JP | 7176757 A | 7/1995 |
| JP | H08-078330 | 3/1996 |
| JP | H08-148423 A | 6/1996 |
| JP | H09-007968 | 1/1997 |
| JP | 9171971 A | 6/1997 |
| JP | H09-270393 | 9/1997 |
| JP | 9260681 A | 10/1997 |
| JP | 9321210 A | 12/1997 |
| JP | 10189998 | 7/1998 |
| JP | H10-244390 | 9/1998 |
| JP | H10-256178 A | 9/1998 |
| JP | 11025064 A | 1/1999 |
| JP | 11064883 A | 3/1999 |
| JP | 11-281997 | 10/1999 |
| JP | H11-297852 | 10/1999 |
| JP | 11330000 A | 11/1999 |
| JP | 2000505241 A | 4/2000 |
| JP | 2000-133613 A | 5/2000 |
| JP | 2000-315652 | 11/2000 |
| JP | 2000346618 | 12/2000 |
| JP | 2001023920 A | 1/2001 |
| JP | 2000223425 | 8/2002 |
| JP | 2002-353142 | 12/2002 |
| JP | 2002353159 A | 12/2002 |
| JP | 2003-031496 | 1/2003 |
| JP | 2004031809 | 1/2003 |
| JP | 2003-037063 A | 2/2003 |
| JP | 2003-068644 A | 3/2003 |
| JP | 2003-509844 | 3/2003 |
| JP | 2003-109912 A | 4/2003 |
| JP | 20003100653 | 4/2003 |
| JP | 2003-133253 A | 5/2003 |
| JP | 2003-347208 A | 12/2003 |
| JP | 2004-311935 | 11/2004 |
| JP | 2005-333117 A | 12/2005 |
| JP | 2007-005508 A | 1/2007 |
| TW | 457553 B | 10/2001 |
| TW | 464960 A1 | 11/2001 |
| TW | 564465 A | 12/2003 |
| TW | 569350 B | 1/2004 |
| WO | WO-97/45827 | 12/1997 |
| WO | WO-98/24118 | 6/1998 |
| WO | WO-99/31719 | 6/1999 |
| WO | WO-00/14784 | 3/2000 |
| WO | WO-01/18854 | 3/2001 |
| WO | WO-01/18855 | 3/2001 |
| WO | WO-01/71786 | 9/2001 |
| WO | WO-01/71791 | 9/2001 |
| WO | WO-01/73769 A1 | 10/2001 |
| WO | WO-02/31869 | 4/2002 |
| WO | WO-02/42847 | 5/2002 |
| WO | WO-02/086954 A1 | 10/2002 |
| WO | WO-02/086955 | 10/2002 |
| WO | WO-03/018882 | 3/2003 |
| WO | WO-03/046965 | 6/2003 |
| WO | WO-03/084688 | 10/2003 |
| WO | WO-2004/017381 | 2/2004 |
| WO | WO-2004017380 A2 | 2/2004 |
| WO | WO-2004/017382 A3 | 4/2004 |
| WO | WO-2004/075263 A3 | 9/2004 |
| WO | WO-2005/029546 A3 | 3/2005 |
| WO | WO-2005/029548 A3 | 3/2005 |
| WO | WO-2005/029551 | 3/2005 |
| WO | WO-2005/029550 A3 | 9/2005 |
| WO | WO-2004/017379 A3 | 12/2005 |
| WO | WO-2006/055003 A1 | 5/2006 |
| WO | WO-2006/107926 | 10/2006 |
| WO | WO-2007/022234 | 2/2007 |
| WO | WO-2009/067687 A1 | 5/2009 |

OTHER PUBLICATIONS

Andrä et al., "Multicrystalline LLC-SI thin film solar cells on low temperature glass," Poster, 3rd world Conference on Photovoltaic Energy Conversion, Osaka, Japan, pp. 1174-1177, May 11-18, 2003.

Bergmann, R. et al., Nucleation and Growth of Crystalline Silicon Films on Glass for Solar Cells, Phys. Stat. Sol., 1998, pp. 587-602, vol. 166, Germany.

Biegelsen, D.K., L.E. Fennell and J.C. Zesch, Origin of oriented crystal growth of radiantly melted silicon on SiO/sub 2, Appl. Phys. Lett. 45, 546-548 (1984).

Boyd, I. W., "Laser Processing of Thin Films and Microstructures, Oxidation, Deposition and Etching of Insulators," (Springer—Verlag Berlin Heidelber, 1987.

Broadbent et al., "Excimer Laser Processing of Al-1%Cu/TiW Interconnect Layers," Proceedings, Sixth International IEEE VLSI Multilevel Interconnection Conference, Santa Clara, CA, Jun. 12-13, pp. 336-345 (1989).

Brotherton et al., "Influence of Melt Depth in Laser Crystallized Poly-Si Thin Film Transistors," Journal of Appl. Phys., 82:4086-4094 (1997).

Brotherton, "Polycrystalline Silicon Thin Film Transistors," Semicond. Sci. Tech., 10:721-738 (1995).

Brotherton, S.D., et al., Characterisation of poly-Si TFTs in Directionally Solidified SLS Si, Asia Display/IDW'01, p. 387-390.

International Search Report for corresponding International Patent Application No. PCT/US2010/033565, mailed Jul. 1, 2010, 1 page.

International Search Report for corresponding International Patent Application No. PCT/US2010/055106, mailed Jan. 4, 2011, 1 page.

Crowder et al., "Low-Temperature Single-Crystal Si TFT's Fabricated on Si Films Processed via Sequential Lateral Solidification," IEEE Electron Device Letter, 19 (8): 306-308 (1998).

Crowder et al., "Parametric Investigation of SLS-processed Polysilicon Thin Films for TFT Applications," Preparations and Characterization, Elsevier, Sequoia, NL, vol. 427, No. 1-2, Mar. 3, 2003, pp. 101-107, XP004417451.

Crowder et al., "Sequential Lateral Solidification of PECVD and Sputter Deposited a-Si Films", Mat. Res. Soc. Symp. Proc. 621:Q.9. 7.1-9.7.6, 2000.

Dassow, R. et al. Laser-Crystallized Polycrystalline Silicon on Glass for Photovoltaic Applications, Solid State Phenomena, pp. 193-198, vols. 67-68, Scitec Publications, Switzerland. (1999).

Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.

Dassow, R. et al., Laser crystallization of silicon for high-performance thin-film transistors, Semicond. Sci. Technol., 2000, pp. L31-L34, vol. 15, UK.

Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).

Endert et al., "Excimer Laser: A New Tool for Precision Micromachining," Optical and Quantum Electronics, 27:1319-1335 (1995).

Extended European Search Report mailed on Oct. 23, 2013 for co-pending EP Application No. 10828974.5; 11 pages.

Fogarassy et al., "Pulsed Laser Crystallization of Hydrogen-Free a-Si Thin Films for High-Mobility Poly-Si TFT Fabrication," Applied Physics A—Solids and Surfaces, 56:365-373 (1993).

(56) References Cited

OTHER PUBLICATIONS

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of SI Films with a moveable-strip heater oven," J. Electro-Chem. Soc., 129: 2812-2818 (1982).

Gosain et al., "Formation of (100)-Textured Si Film Using an Excimer Laser on a Glass Substrate," Jpn. J. Appl. Phys., vol. 42 (2003) pp. L135-L137.

Gupta et al., "Numerical Analysis of Excimer-laser induced melting and solidification of Si Thin Films", Applied Phys. Lett., 71:99-101, 1997.

Hau-Riege et al., "The Effects Microstructural Transitions at Width Transitions on interconnect reliability," Journal of Applied Physics, 87(12): 8467-8472 (Jun. 15, 2000).

Hawkins, W.G. et al., "Origin of lamellae in radiatively melted silicon flims," Appl. Phys. Lett. 42(4), pp. 358-360, Feb. 15, 1983.

Hayzelden, C. and J.L. Batstone, Silicide formation and silicide-mediated crystallization of nickel-implanted amorphous silicon thin films, J. Appl. Phys. 73, 8279-8289 (1993).

Im et al., "Controlled Super-Lateral Growth of Si Films for Microstructural Manipulation and Optimization," Phys. Stat. Sol. (a), 166:603-617 (1998).

Im et al., "Crystalline Si Films for Integrated Active-Matrix Liquid-Crystals Displays," MRS Bulletin, 21:39-48 (1996).

Im et al., "On the Super Lateral Growth Phenomenon Observed in Excimer Laser-Induced Crystallization of Thin Si Films," Appl. Phys. Lett., 64 (17): 2303-2305 (1994).

Im et al., "Phase Transformation Mechanisms Involved in Excimer Laser Crystallization of Amorphous Silicon Films," Appl. Phys. Lett., 63 (14): 1969-1971 (1993).

Im et al., "Single-Crystal Si Films for Thin-Film Transistor Devices," Appl. Phys. Lett., 70(25): 3434-3436 (1997).

Im et al., U.S. Appl. No. 11/141,815, Jun. 1, 2005, 30 pages.

Im et al., U.S. Appl. No. 11/293,655, Dec. 2, 2005, 68 pages.

Im, J.S., Method and system for producing crystalline thin films with a uniform crystalline orientation, U.S. Appl. No. 60/503,419; ref. file # 36013(BB); Columbia ref. M02-063.

Ishida et al., "Ultra-shallow boxlike profiles fabricated by pulsed ultraviolet-laser doping process," J. Vac. Sci. Technol. B 12(1): 399-403, (1994).

Ishihara et al., "A Novel Double-Pulse Excimer-Laser Crystallization Method of Silicon Thin-Films," Publication Office, Japanese Journal of Applied Physics, Tokyo, Japan, 34(8A): 3976-3981 (1995).

Jeon et al., "New Excimer Laser Recrystalization of Poly-Si for Effective Grain Growth and Grain Boundary Arrangement," Jpn. J. Appl. Phys. vol. 39 (2000) pp. 2012-2014, Part 1, No. 4B, Apr. 2000.

Jeon et al., "Two-step laser recrystalization of poly-Si for effective control of grain boundaries," Journal of Non Crystalline Solids, 266-269: 645-649 (2000).

Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.

Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.

Kahlert, H., "Creating Crystals," OE Magazine, Nov. 2001, 33-35.

Kim et al., "Grain Boundary Location-Controlled Poly-Si Films for TFT Devices Obtained Via Novel Excimer Laser Process," Mat. Res. Soc. Symp. Proc., vol. 358,pp. 903-908 (1995).

Kim et al., "Multiple Pulse Irradiation Effects in Excimer Laser-Induced Crystallization of Amorphous Si Films," Mat. Res. Soc. Sym. Proc., 321:665-670 (1994).

Kim, C. et al., Development of SLS-Based SOG Display, IDMC 2005, Thu-15-02, 252-255.

Kim, "Excimer-Laser-Induced Crystallization of Amorphous Silicon Thin Films," Ph. D. Dissertation Abstract, Columbia University, 1996.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, pp. 703-708 (1993).

Kim, H.-J., et al., "The effects of dopants on surface-energy-driven secondary grain growth in silicon films," J. Appl. Phys. 67 (2), pp. 757-767 (Jan. 15, 1990).

Kim, H.J. et al., "Multiple Pulse Irradiation Effects in Excimer Laser_Induced Crystallization of Amorphous Si Films," Materials Research Society Symposium Proceedings, vol. 321, pp. 665-670, 1994.

Kim, H.J. et al., "New Excimer-laser-crystallization method for producing large-grained and grain boundary-location-controlled Si Films for Thin Film Transistors", Applied Phys. Lett., 68: 1513.

Kimura, M. and K. Egami, Influence of as-deposited film structure on (100) texture in laser-recrystallized silicon on fused quartz, Appl. Phys. Lett. 44, 420-422 (1984).

Knowles, D.S. et al., "P-59: Thin Beam Crystallization Method: a New Laser Annealing Tool with Lower Cost and Higher Yield for LTPS Panels," SID 00 Digest, pp. 1-3.

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422-2428 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683-685 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190-6195 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657-5662 (1994).

Lee, S.-W. and S.-K. Joo, Low temperature poly-Si thin-film transistor fabrication by metal-induced lateral crystallization, IEEE Electron Device Letters 17, 160-162 (1996).

Lee, S.-W., Y.-C. Jeon and S.-K. Joo, Pd induced lateral crystallization of amorphous Si thin films, Appl. Phys. Lett. 66, 1671-1673 (1995).

Leonard, J.P. et al, "Stochastic modeling of solid nucleation in super-cooled liquids", Appl. Phys. Lett. 78:22, May 28, 2001, 3454-3456.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on Insulator Devices, Eds. P.L.F. Hemment, Kluwer Academic Publishers 2000, pp. 55-61.

Mariucci et al., "Grain boundary location control by patterned metal film in excimer laser crystallized polysilicon," Proceedings of the Fifth International Conference on Polycrystalline Semiconductors, Schwabisch Gmund, Germany, 67-68: 175-180 (1998).

McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, 43(10): 946-948 (1983).

(56) References Cited

OTHER PUBLICATIONS

MICRO/LAS Lasersystem GMBH, "Overview of Beam Delivery Systems for Excimer Lasers," (1999). 20 pages.

MICRO/LAS Lasersystem GMBH, "UV Optics Systems for Excimer Laser Based Micromachining and Marking," (1999). 11 pages.

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944-946 (2002).

Miyata et al, "Low-Temperature Polycrystalline Silicon Thin-Film Transistors for Large-Area Liquid Crystal Display," Japanese J. of Applied Physics, Part 1—Regular Papers Short Notes & Review Papers, 31:4559-62 (1992).

Nebel, "Laser Interference Structuring of A-SI:h" Amorphous Silicon Technology—1996, San Francisco, CA Apr. 8-12, Materials Research Society Symposium Proceedings, vol. 420, Pittsburgh, PA, pp. 117-128 (1996).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Noguchi, "Appearance of Single-Crystalline Properties in Fine-Patterned Si Thin Film Transistors (TFTs) by Solid Phase Crystallization (SPC)," Jpn. J. Appl. Phys., 32:L1584-L1587 (1993).

Ozawa et al., "Two-Dimensionally Position-Controlled Excimer-Laser-Crystallization of Silicon Thin Films on Glassy Substrate," Jpn. J. Appl. Phys. 38(10):5700-5705 (1999).

Sato et al., "Mobility anisotropy of electrons in inversion layers on oxidized silicon surfaces," Physical Review B (State) 4, 1950 (1971).

Sinke et al., "Explosive crystallization of amorphous silicon: Triggering and propagation," Applied Surface Science, vol. 43, pp. 128-135 (1989).

Smith, H.I. et al, "The Mechanism of Orientation in Si Graphoepitaxy by Laser Strip Heater Recrystallization," J. Electrochem. Soc.: Solid-State Science and Technology, vol. 130, No. 10, Oct. 1983, pp. 2050-2053.

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Sposili et al., "Sequential Lateral Solidification of Thin Silicon Films on SiO2," Appl. Phys. Lett., 69(19): 2864 (1996).

Sposili et al., "Single-Crystal Si Films via a Low-Substrate-Temperature Excimer-Laser Crystallization Method," Mat. Res. Soc. Symp. Proc., 452: 953-958 (1997).

Thompson, C.V. and H.I. Smith, Surface-energy-driven secondary grain growth in ultrathin (<100 nm) films of silicon, Appl. Phys. Lett. 44, 603 (1984).

Van Der Wilt, "A hybrid approach for obtaining orientation-controlled single-crystal Si regions on glass substrates," Proc. of SPIE vol. 6106, 61060B-1 to B-15, (2006).

van der Wilt, P.C. et al., "State-of-the-Art Laser Crystallization of Si for Flat Panel Displays," PhAST, May 18, 2004, pp. 1-34.

van der Wilt, P.C. et al., "The Commercialization of the SLS Technology," Taiwan FPD, Jun. 11, 2004, pp. 1-12.

van der Wilt, P.C., "Textured poly-Si films for hybrid SLS," Jul. 2004, pp. 1-5.

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Watanabe et al., "Crystallization Process of Polycrystalline Silicon by KrF Excimer Laser Annealing," Japanese J. of Applied Physics, Part 1—Regular Papers Short Notes & Review Papers, 33:4491-98 (1994).

Weiner, K. H. et al. "Laser-assisted, Self-aligned Silicide Formation," A Verdant Technologies technical brief, Aug. 7, 1997, 1-9.

Weiner, K. H. et al., "Ultrashallow Junction Formation Using Projection Gas Immersion Laser Doping (PGILD)," A Verdant Technologies Technical Brief, Aug. 20, 1997.

Werner, J.H., et al. From polycrystalline to single crystalline silicon on glass, Thin Solid Films 383, 95-100, 2001.

White et al., "Characterization of thin-oxide MNOS memory transistors," IEEE Trans. Electron Devices ED-19, 1280 (1972).

Yamamuchi et al., "Polycrystalline silicon thin films processed with silicon ion implantation and subsequent solid-phase crystallization: Theory, experiments, and thin-film transistor applications," Journal of Applied Physics, 75(7):3235-3257(1994).

Yoshimoto et al., "Excimer-Laser-Produced and Two-Dimensionally Position-Controlled Giant Si Grains on Organic SOG Underlayer," p. 285-286, AM-LCD (2000).

\* cited by examiner

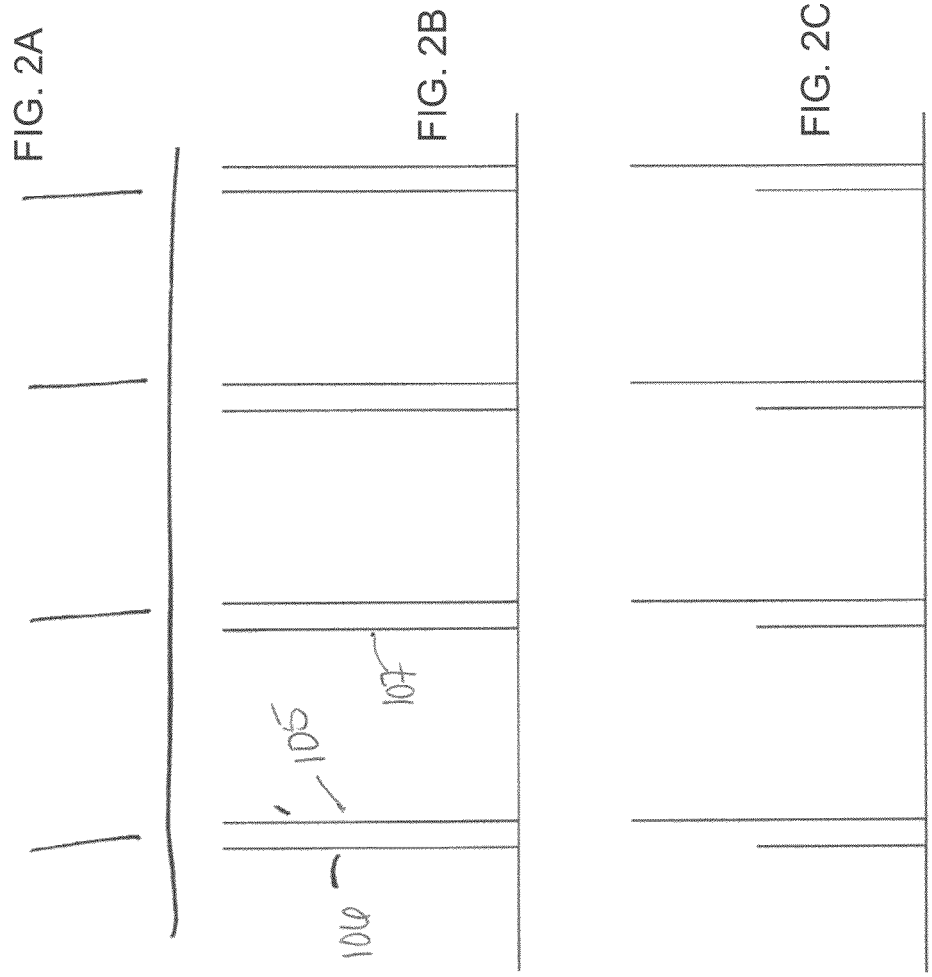

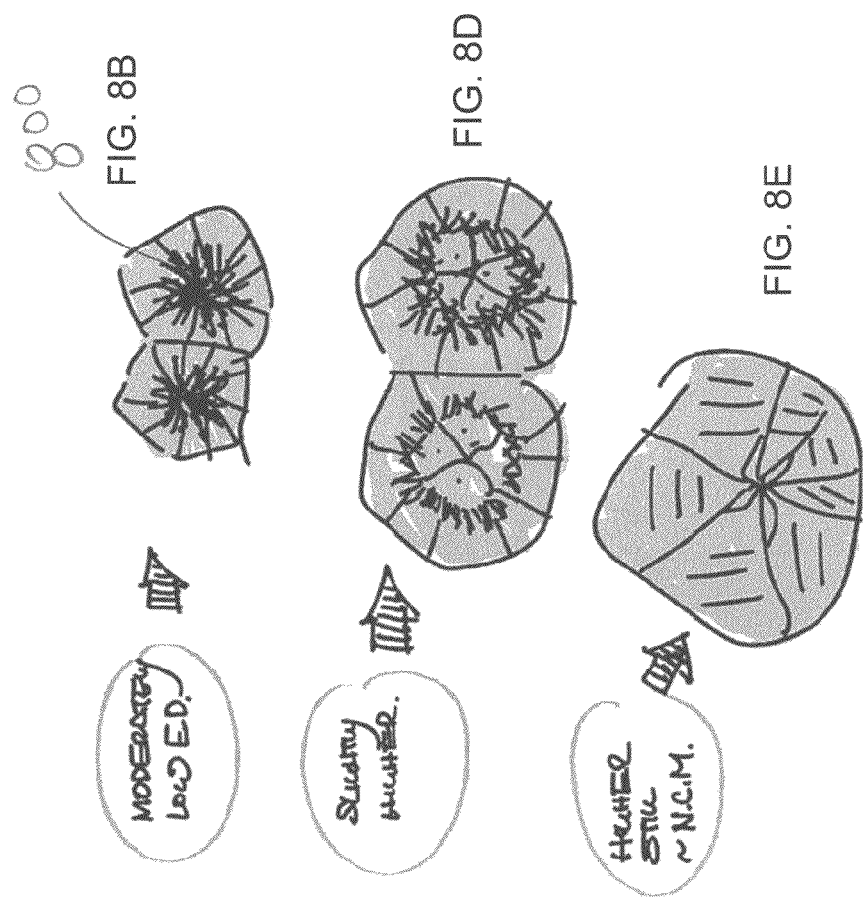
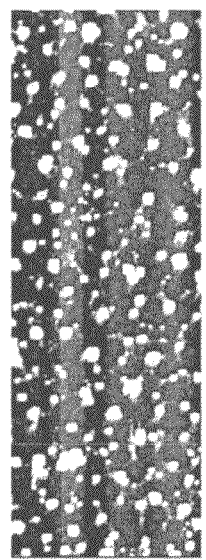
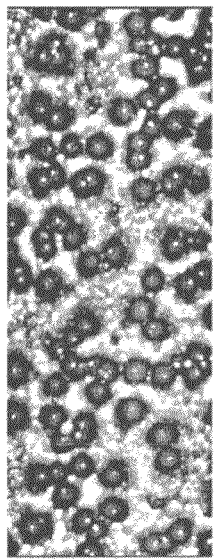

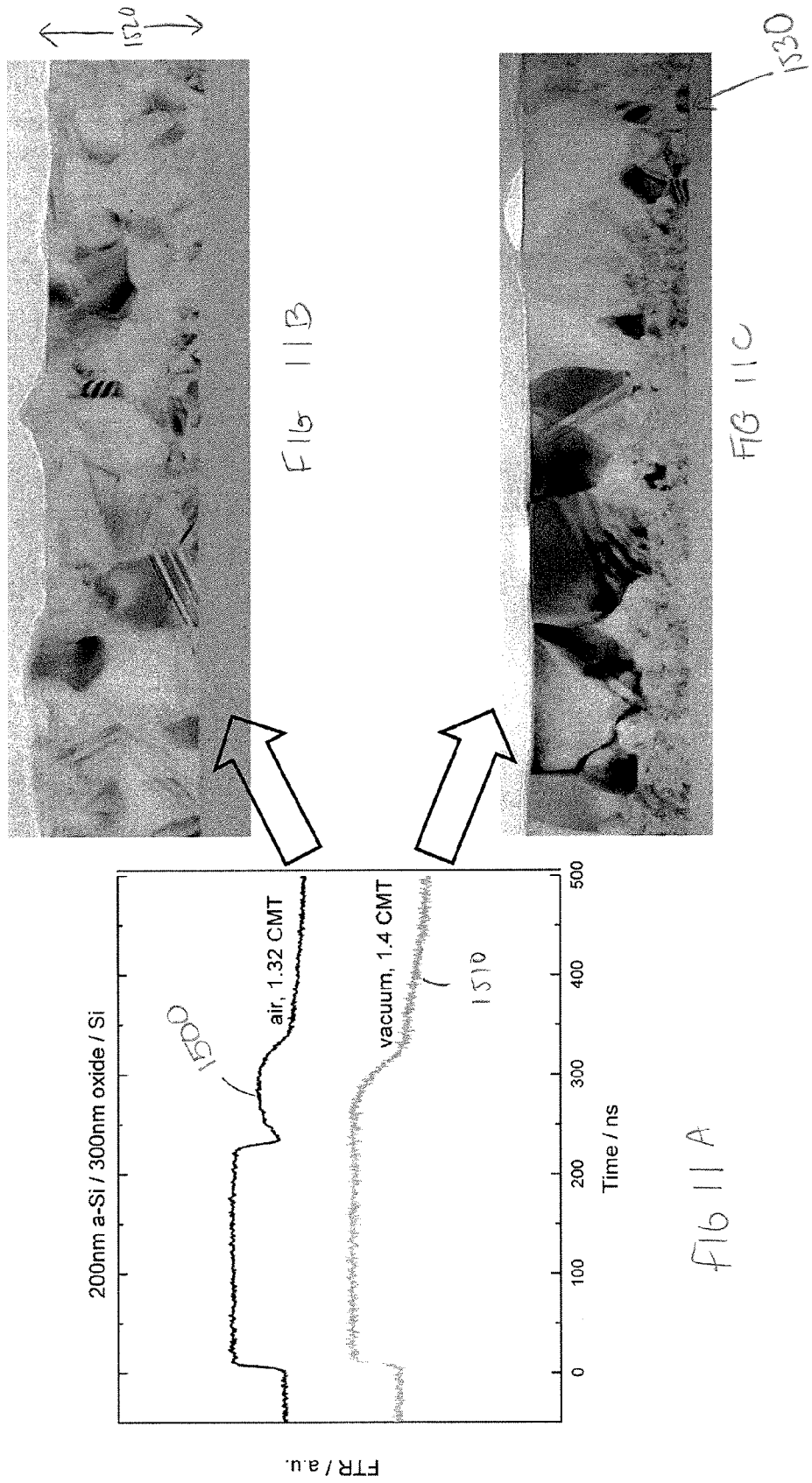

SYSTEMS AND METHODS FOR NON-PERIODIC PULSE PARTIAL MELT FILM PROCESSING

CROSS REFERENCE TO RELATED APPLICATIONS

This application is a U.S. national phase application under 35 U.S.C. §371 of International Patent Application No. PCT/US2010/055106 filed Nov. 2, 2010, which claims priority to U.S. Provisional Application No. 61/257,650 entitled "Method For Obtaining Uniformly Sized Small Grain Polycrystalline Silicon With Low Intragrain Defect-Density Films Through Complete Melt Crystallization," filed Nov. 3, 2009; U.S. Provisional Application No. 61/257,657 entitled "Method For Obtaining Uniformly Sized Small Grain Polycrystalline Silicon With Low Intragrain Defect-Density Films Through Partial Melt Crystallization," filed Nov. 3, 2009; U.S. Provisional Application No. 61/264,082 entitled "Systems and Methods for Advanced Excimer Laser Annealing," filed Nov. 24, 2009; U.S. Provisional Application No. 61/286,643 entitled "Systems and Methods for Advanced Excimer Laser Annealing," filed Dec. 15, 2009; U.S. Provisional Application No. 61/291,488 entitled "Systems and Methods for Advanced Excimer Laser Annealing," filed Dec. 31, 2009; U.S. Provisional Application No. 61/291,663 entitled "Advanced Single-Scan SLS," filed Dec. 31, 2009; and U.S. Provisional Application No. 61/294,288 entitled "Sequential Firing SLS," filed Jan. 12, 2010. International Patent Application No. PCT/US2010/055106 is also a continuation of U.S. patent application Ser. No. 12/776,756 entitled "Systems and Methods for Non-Periodic Pulse Sequential Lateral Solidification," filed May 10, 2010, which is a continuation of PCT International Patent Application No. PCT/US2010/033565 entitled "Systems and Methods for Non-Periodic Pulse Sequential Lateral Solidification," filed May 4, 2010, and claims priority to U.S. Provisional Application Nos. 61/264,082, 61/286,643, 61/291488, 61/291,663 and 61/294,288. PCT International Patent Application No. PCT/US2010/033565 also claims priority to U.S. Provisional Application Nos. 61/264,082, 61/286,643, 61/291488, 61/291,663 and 61/294,288. The entirety of each of the disclosures of which are explicitly incorporated by reference herein.

All patents, patent applications, patent publications and publications cited herein are explicitly incorporated by reference herein in their entirety. In the event of a conflict between the teachings of the application and the teachings of the incorporated document, the teachings of the application shall control.

BACKGROUND

In the field of semiconductor processing, a number of techniques have been described to convert thin amorphous silicon films into polycrystalline films. One such technique is excimer laser annealing ("ELA"). ELA is a pulsed-laser crystallization process that can produce polycrystalline films having uniform crystal grains on substrates, such as, but not limited to, substrates that are intolerant to heat (e.g., glass and plastics). Examples of ELA systems and processes are described in commonly-owned U.S. Patent Publication Nos. 20090309104, entitled "Systems and Methods for Creating Crystallographic-Orientation Controlled Poly-Silicon Films," filed Aug. 20, 2009; 20100065853, entitled "Process and System for Laser Crystallization Processing of Film Regions on a Substrate to Minimize Edge Areas, and Structure of Such Film Regions," filed Sep. 9, 2009, and 20070010104, entitled "Processes and Systems for Laser Crystallization Processing of Film Regions on a Substrate Utilizing a Line-Type Beam, and Structures of Such Film Regions," filed Mar. 9, 2006.

Conventional ELA tools use a single line beam that is continuously scanned at a low velocity over the surface of a sample with large overlap between pulses (e.g. 95%) to establish a large number of pulses per unit area in a single scan. Thus, in ELA, a region of the film is irradiated by an excimer laser to partially melt the film, which subsequently crystallizes. Repetitive partial melting of the film can lead to formation of small-grained polycrystalline films; however, the method often suffers from microstructural non-uniformities, which can be caused by pulse to pulse energy fluctuations and/or non-uniform beam intensity profiles. A large number of pulses is not only required to induce the cumulative effects that lead to more uniform grain size, but also to mitigate the effects of the short axis beam edges. In the beam edge segments of the beam, the energy gradually reduces to zero. Depending on the location in the film, location-dependent variation in the initial pulse energy sequence can occur. Such variation is not easily removed by the subsequent ELA process and artifacts in pixel brightness (i.e., mura) may result. FIG. 1A illustrates a random microstructure that may be obtained with ELA. The Si film is irradiated multiple times to create the random polycrystalline film with a uniform grain size. FIG. 1B depicts a conventional ELA single-scan, showing the cross section of the line beam 101 on its short axis as the beam 101 scans a film 104. The beam 101 is advanced in the direction of the arrow 102 and a region 103 of the film 104 can be irradiated with multiple laser pulses as the beam 101 moves across the film 104.

Further, crystallization methods and tools that can be used for obtaining a uniform grain structure ("UGS") at very high throughput have been reported. For example, such a system is disclosed in United States Application Publication No. 20070010104 entitled "Processes and Systems for Laser Crystallization Processing of Film Regions on a Substrate Utilizing a Line-Type Beam, and Structures of Such Film Regions." UGS is a single pulse irradiation process that can involve complete-melt crystallization ("CMC") and/or partial-melt crystallization ("PMC") of the film being crystallized. An additional feature of the UGS process is the position-controlled firing of laser pulses so that partial or complete melting occurs only in those regions where columns/rows of pixel thin-film transistors ("TFTs") reside. When the stepping distance between pulses exceeds the width of the line beam, unirradiated regions (e.g. amorphous as-deposited Si) of the film remain in between such columns. This selective-area crystallization ("SAC") process can thus have very high throughput as the average number of pulses per unit area could be less than one.

However, none of the prior tools are especially well optimized for ELA for very large films, for example as used in televisions that have a low density of pixels. Conventional ELA is an inefficient process for such substrates, in that time and resources are wasted to crystallize the Si substrate between pixel locations. While UGS tools allow one to skip those areas, the material that is obtained is significantly more defective than the typical ELA material and also uniformity of the material may not be sufficient when typical radiation conditions are used.

SUMMARY

A non-periodic pulse method and tool is described using position controlled sequential triggering of lasers. The system can be implemented using multiple lasers to create distinct non-periodic laser pulses in the crystallization process, i.e., distinct in that each laser pulse results in a separate partial melting and solidification cycle. Multiple lasers are used in a coordinated pulse sequence to irradiate and crystallize selected areas of a film in a single scan or multiple scans.

In one aspect, the present disclosure relates to a method of processing a thin film including, while advancing a thin film in a first selected direction, irradiating a first region of the thin film with a first laser pulse and a second laser pulse, each laser pulse providing a shaped beam and having a fluence that is sufficient to partially melt the thin film and the first region re-solidifying and crystallizing to form a first crystallized region, and irradiating a second region of the thin film with a third laser pulse and a fourth laser pulse, each pulse providing a shaped beam and having a fluence that is sufficient to partially melt the thin film and the second region re-solidifying and crystallizing to form a second crystallized region, wherein the time interval between the first laser pulse and the second laser pulse is less than half the time interval between the first laser pulse and the third laser pulse.

In some embodiments, the time interval between the first laser pulse and the second laser pulse is longer than a time interval for a single melting and solidification cycle of the thin film. In some embodiments, each of the first laser pulse and the second laser pulse has the same energy density, each of the first laser pulse and the second laser pulse has a different energy density, each of the first laser pulse and the second laser pulse achieve the same degree of melting of the thin film, and/or each of the first laser pulse and the second laser pulse achieve a different degree of melting of the thin film. In some embodiments, the thin film can be an amorphous silicon film devoid of pre-existing crystallites. In some embodiments, the first laser pulse has an energy density sufficient to melt the amorphous silicon film and produce crystal structures having defective core regions. In some embodiments, the second laser pulse has an energy density sufficient to re-melt the defective core regions to produce a uniform fine-grained crystalline film.

In some embodiments, the thin film can be an amorphous silicon film. In some embodiments, the thin film is deposited using one of low pressure chemical vapor deposition, plasma enhanced chemical vapor deposition, sputtering, and electron beam evaporation.

In some embodiments, the thin film can be a processed silicon film. In some embodiments, the processed silicon film is an amorphous silicon film devoid of pre-existing crystallites that has subsequently been processed according to a method including while advancing the amorphous silicon film in a second selected direction, irradiating the amorphous silicon film with an extended laser pulse having a fluence sufficient to partially melt the amorphous silicon film.

In some embodiments, the extended laser pulse is created by sequential overlapping of laser pulses from a plurality of laser sources wherein the delay between pulses is short enough to induce a single melting and solidification cycle. In some embodiments, the amorphous silicon film is obtained via plasma-enhanced chemical vapor deposition. In some embodiments, the extended laser pulse can have a pulse length of greater than 300 ns full width half maximum.

In some embodiments, the processed silicon film is a silicon film that is processed according to a method including while advancing the silicon film in a second selected direction, irradiating the silicon film with a laser pulse having a fluence sufficient to completely melt the silicon film. In some embodiments, the laser pulse is created by overlapping of laser pulses from a plurality of laser sources.

In some embodiments, the method includes while advancing the thin film in a second selected direction, irradiating a third region of the thin film with a fifth laser pulse and a sixth laser pulse, each laser pulse providing a shaped beam and having a fluence that is sufficient to partially melt the thin film and the third region re-solidifying and crystallizing to form a third crystallized region and irradiating a fourth region of the thin film with a seventh laser pulse and an eighth laser pulse, each pulse providing a shaped beam and having a fluence that is sufficient to partially melt the thin film and the fourth region re-solidifying and crystallizing to form a fourth crystallized region, wherein the time interval between the fifth laser pulse and the sixth laser pulse is less than half the time interval between the fifth laser pulse and the seventh laser pulse. In some embodiments, the second selected direction is opposite the first selected direction and wherein the third region overlaps the second region and the fourth region overlaps the first region.

In some embodiments, the second selected direction is the same as the first selected direction and the third region overlaps the first region and the fourth region overlaps the second region. In some embodiments, the method includes shifting the thin film in a direction perpendicular to the first selected direction prior to advancing the thin film in the second selected direction. In some embodiments, each laser pulse can be a line beam with a top portion having a uniform energy density. In some embodiments, each laser pulse can be a flood irradiation pulse.

Another aspect of the present disclosure relates to a thin film processed according to the method above. Another aspect of the present disclosure relates to a device having a thin film processed according to the method above, wherein the device includes a plurality of electronic circuits placed within a plurality of crystallized regions of the thin film. In some embodiments, the device can be a display device.

In one aspect, the present disclosure relates to a system for processing a thin film using non periodic laser pulses including primary and secondary laser sources for generating laser pulses; a work surface for securing a thin film on a substrate; a stage for moving the thin film with respect to the beam pulses and thereby creating a propagation direction of the laser beam pulses on the surface of the thin film; and a computer for processing instructions for stage synchronized laser pulsing to provide a first region of a thin film loaded into the moveable stage to be irradiated by a first laser pulse from the primary source, a second region of the thin film to be irradiated by a second laser pulse from the secondary source, and a third region of the thin film to be irradiated by a third laser pulse from the primary source, wherein processing instructions are provided for moving the film with respect to the beam pulses in the propagation direction to irradiate the first and second and third regions, wherein the distance between the center of the first region and the center of the second region is less than half the distance between the center of the first region and the center of the third region, and wherein the first, second, and third laser pulses have a fluence sufficient to partially melt the thin film. In some embodiments, the stage moves at a constant velocity.

Another aspect of the present disclosure relates to a method of converting an amorphous silicon film devoid of pre-existing crystallites into a small grained film, the method includes while advancing the amorphous silicon film in a first selected direction, irradiating the amorphous silicon film with an extended laser pulse having a fluence sufficient to partially melt the amorphous silicon film, wherein the small grained film can have grains having average lateral dimensions less than the thickness of the film. In some embodiments, the extended laser pulse can have a pulse length of greater than 300 ns full width half maximum and is a flood irradiation pulse. In some embodiments, the extended laser pulse is created by delayed overlapping of laser pulses from a multitude of laser sources wherein the delay between pulses is short enough to induce a single melting and solidification cycle. In some embodiments, the amorphous silicon film is obtained via plasma-enhanced chemical vapor deposition.

Another aspect of the present disclosure relates to a method for processing a thin film, including providing a semiconductor thin film on a substrate, the thin film having a bottom interface located at a bottom surface adjacent to the substrate and a top surface opposite the bottom surface; and irradiating the thin film with a laser beam having an energy density greater than 1.3 times the complete melt threshold of the film, the energy density being selected to completely melt the film; and wherein at the onset of solidification a cap layer is present to form a surface interface at the top surface of the semiconductor film; wherein after irradiation and complete melting of the film heterogeneous nucleation occurs at both the top interface and the bottom interface and wherein upon cooling the heterogeneous nucleation forms low-defect silicon grains at the bottom surface of the film. In some embodiments, the laser beam has a pulse duration greater than 80 ns, 200 ns or 400 ns. In some embodiments, the semiconductor thin film includes a silicon film that is between about 100 nm to about 300 nm thick. In some embodiments, the substrate can be glass or quartz. In some embodiments, the grains can be small equiaxed grains. In some embodiments, the energy density of the laser beam is 1.4 times the local complete melt threshold. In some embodiments, the cap layer is formed by depositing a thin layer on the top surface of the thin film prior to irradiation. In some embodiments, the cap layer can be an oxide layer with a thickness of less than 50 nm. In some embodiments, the cap layer is formed by irradiating the thin film in an oxygenated environment. In some embodiments, the oxygenated environment can be air. In some embodiments, the oxygenated environment can be only oxygen. In some embodiments, the substrate can be a patterned metallic film covered by an insulting film and wherein the energy density is greater than 1.3 times the complete melting threshold of the thin film. In one aspect the disclosure relates to a bottom-gate TFT made according to the method above, wherein the patterned metallic film can be a bottom gate and the insulating film can be a gate dielectric.

The non periodic system and method is capable of high throughput ELA and selective-area crystallization. Such a process is desirable for active matrix organic light emitting diodes ("AMOLED") TV and ultra-definition liquid crystal ("UD-LCD"). For both these products, amorphous silicon lacks performance and stability, while current low-performance low temperature polysilicon ("LTPS") technology is not viewed as cost competitive at the panel sizes required (e.g., Gen8, up to 2.2×2.5 m$^2$).

BRIEF DESCRIPTION OF THE DRAWINGS

The following description will be more readily understood with references to the following drawings in which:

FIGS. 2A-2C depict exemplary energy profiles of laser pulses according to an embodiment of the present disclosure;

FIG. 6 depicts a non-periodic pulse ELA process, according to an embodiment of the present disclosure;

FIG. 8A depicts the crystallographic structure of a film after one irradiation, according to an embodiment of the present disclosure;

FIG. 8B is an illustration of the crystal structure in FIG. 9A, according to an embodiment of the present disclosure;

FIG. 8C depicts an atomic force microscope ("AFM") scan of the surface of a film after one irradiation at a higher energy density but still in the PMC regime, according to an embodiment of the present disclosure;

FIG. 8D is an illustration of the crystal structure in FIG. 8C according to an embodiment of the present disclosure;

FIG. 8E shows a circular region that was formed upon lateral crystallization from an unmelted seed, according to an embodiment of the present disclosure;

FIG. 11A depicts a graph of time in nanoseconds (x-axis) versus normalized reflectance values (y-axis) for a 200 nm a-Si film with a 300 nm oxide surface layer in air at 1.32 CMT and in vacuum at 1.4 CMT, according to an embodiment of the present disclosure;

FIG. 11B is an image of the microstructure obtained in the air environment.

FIG. 11C is an image of the microstructure obtain in the vacuum environment.

DESCRIPTION

Figure 1A:
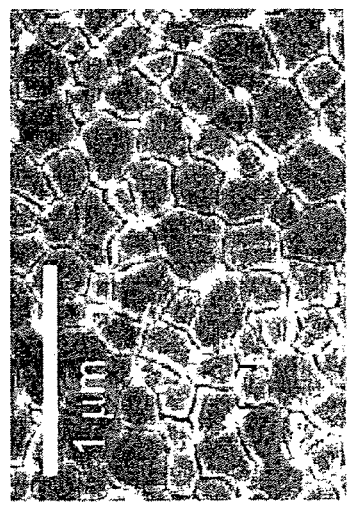
FIG. 1A illustrates a random microstructure that may be obtained with ELA.
Figure 1B:
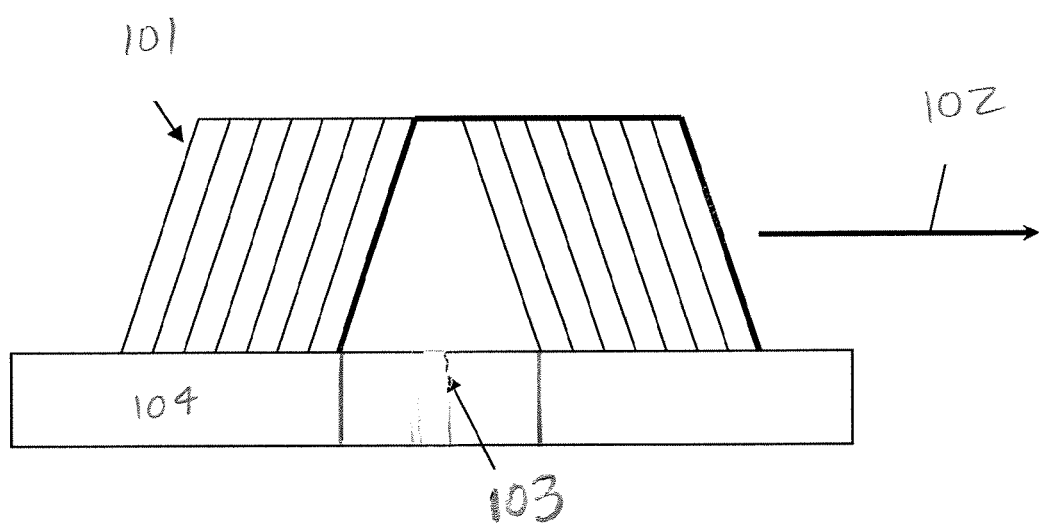
FIG. 1B depicts a conventional ELA single-scan.

The present disclosure relates to systems and methods for using non periodic pulse laser techniques in combination with partial melt crystallization and complete melt crystallization techniques to form uniform polycrystalline films. In some embodiments, non periodic pulse ELA is used to produce fine grained uniform crystalline films from an amorphous as-deposited Si films devoid of pre-existing crystallites, for example films obtained by low pressure chemical vapor deposition (LPCVD), plasma-enhanced chemical vapor deposition (PECVD), sputtering, or e-beam evaporation. In some embodiments, a flood irradiation method can be used to either produce a fine grained uniform crystalline film or to produce a precursor film for a non-periodic pulse irradiation method. The flood irradiation method can be a two shot partial melt process wherein an amorphous silicon film devoid of any pre-existing crystallites (e.g., a PECVD film) is transformed in two steps into a fine grained uniform crystalline film with grains having average lateral dimensions exceeding the film thickness, i.e., small columnar grains. The flood irradiation method can also be an extended duration single shot partial melt process wherein an amorphous silicon film devoid of any pre-existing crystallites (e.g., a PECVD film) is transformed into a fine grained uniform crystalline film with grains having average lateral dimensions less than the film thickness. The flood irradiation method also can be a complete melt process wherein an amorphous silicon film of any kind having oxide interfaces at both the top and the bottom of the film is transformed into a low-defect small equiaxed grain Si film.

A non-periodic pulse ELA method and tool is described using position controlled sequential triggering of lasers. The system can be implemented using multiple lasers to create distinct non-periodic laser pulses in the crystallization process, e.g., distinct in that each laser pulse results in a separate partial melting and solidification cycle and non-periodic in that the intervals between pulses are not the same. Multiple lasers are used in a coordinated pulse sequence to irradiate and crystallize selected areas of a film in a single scan or in multiple scans. Multiple scans may be desirable to reach a larger number of melting and solidification cycles in regions of interest in order to benefit from the cumulative effects of multiple irradiations observed in ELA that lead to more uniform polycrystalline films with, for example, a tighter grain-size distribution.

Non-Periodic Pulsing

Exemplary sequences of laser pulses are depicted in FIGS. 2A-2C. The y axis represents energy density and the x axis represents time. FIG. 2A depicts a periodic pulse rate of a laser that can be used for a conventional ELA process. The periodic laser repetition rate results in a laser pulse pattern that is evenly spaced in the time domain. FIG. 2B represents an example of non-periodic pulsing disclosed herein where a second pulse 105 is fired in close time relation to the first pulse 106. Then, a third pulse 107 is fired at time interval different than the interval between the first pulse 106 and the second pulse 105. FIG. 2C illustrates an embodiment for which both the pulse rate and the laser power (energy density) of the laser pulses are different. Thus, the irradiated film experiences a non-periodic pulse rate and variable irradiation energy. Because of the relatively short time between the first pulse 106 and the second pulse 105, the regions irradiated by the first pulse 106 and the second pulse 105 experience an increased overlap.

The time delay between the first pulse 106 and the second pulse 105 can be less than half of the time interval between the first pulse 106 and the third pulse 107. In some embodiments, the time interval between first pulse 106 and the second pulse 105 is less than one tenth or less than one twentieth or less than one hundredth the time interval between the first pulse 106 and the third pulse 107. The time delay between the first pulse 106 and the second pulse 105 can be about three microseconds to about one millisecond, about five microseconds to about 500 microseconds, and about 10 microseconds to about 100 microseconds.

Thus, FIGS. 2B and 2C present a non-periodic pulse pattern that employs two closely spaced or a "train" of two laser pulses; however, a greater number of closely spaced pulses, e.g., 3-5 or more, corresponding to three to five or more lasers or laser cavities may be employed. In such embodiments, where a higher number of closely spaced pulses from different lasers, e.g., laser beams from either two different laser energy sources or two different laser carriers of the same laser energy source, are used, the targeted region is irradiated a correspondingly greater number of times. For example, n pulses from n laser sources may be closely spaced to form a train of n laser pulses and a single region will experience n irradiations in a single scan. The beam may have similar widths as in conventional ELA process.

The two consecutive pulses in a pulse train need not be at the same energy density. For example, if the film is still hot from the first pulse, the second pulse could be at a lower energy density than the first pulse. Likewise, a higher energy density may be used to compensate for the changes in optical properties upon the first pulse (amorphous silicon absorbing slightly better than crystalline silicon for UV light). Proper choices for the energy density of the second pulse may thus take in account both effects and possibly others as well so that the film will experience the same degree of melting. Here, the degree of melting is understood to be a measure of melting independent of the details of melting, which may vary significantly as a function of precursor phase (amorphous or crystalline), heterogeneity (e.g., uniformly defective or having defective cores surrounded by larger and cleaner grains), and surface morphology (smooth or rough, for example having periodicity similar to the wavelength of light). The same degree of melting is thus achieved when the extent of melting during the second pulse is equivalent to that of the first pulse, for example about 80% of the film. In a multiple scan process that aims to benefit from the cumulative effects that lead to more uniform polycrystalline films it is desired that most of the pulses result in the same degree of melting so that the process is most efficient.

Thus, as shown in FIG. 2C, the first laser pulse and the second laser pulse can have different energy densities. Specifically, FIG. 2C depicts the first laser pulse having a smaller energy density than the second pulse. However, in some embodiments, the second laser pulse has a smaller energy density than the first laser pulse. Further, in a multiple scan process, the offset between the energy densities of the first pulse and the second pulse may be different or absent in different scans. For example, the offset in energy density between the first and second pulses in a first scan may be selected to compensate for a change in optical properties while in a second scan, the offset may be selected to compensate for temperature. In some embodiments, even though the two pulses may have different energy densities, a second lower energy pulse may cause the same amount of melting in the film as a first higher energy pulse due to residual heat in the film from the first pulse.

In one embodiment, the present system creates non-periodic laser pulses by using coordinated triggering of pulses from a plurality of laser sources (as is also possible using a single laser source having multiple laser cavities, e.g., tubes) to produce a series of pulses closely spaced in the time domain. A plurality of laser sources may be incorporated into a single laser system. A laser system is a computer controlled system that uses computer controlled techniques to irradiate a substrate in a predetermined manner, e.g., the computer controls the firing of the lasers and the movement of the stage, and one or more laser cavities to produce one or more laser beams. Each laser beam corresponds to one laser source. Each laser beam can be produced from a stand alone laser, or a laser cavity which is part of a plurality of laser cavities contained within one laser system.

Tools having multiple laser cavities, e.g. tubes, have been disclosed previously to (1) increase the pulse energy by simultaneously triggering and subsequently combining multiple pulses and (2) increase the pulse duration by delayed triggering of various tubes and subsequently combining them, as discussed in U.S. Pat. No. 7,364,952, entitled "Systems and Methods for Processing Thin Films," issued Apr. 29, 2008. In other words, pulses are combined to provide a modified single melting and solidification cycle. Non-periodic pulse ELA is different in that it uses the pulses of various lasers in separate melting/solidification cycles. However, the pulses are close enough in the time domain that they show significant overlap while the stage is traveling at high speed.

Further, the non-periodic pulse ELA method and tool also can be used to perform selective-area crystallization of a film in order to crystallize only those areas of the film that will be formed into electronics. The non-periodic pulse ELA method and tool provides selective-area crystallization resulting in crystal growth in a first region of the film, followed by a break determined by the repetition rate of the lasers and then substantial overlap in the second pulses of the two or more lasers resulting in crystal growth in a second region of the film. The timing between laser pulses gives rise to non periodic laser pulse sequences and substantial overlap in irradiated regions, which is discussed in detail below. Such methods and systems can be used for ELA processes at high throughput.

In selective-area crystallization, the film is crystallized at locations where electronic devices are made (in a subsequent process not discussed here). However, not all electronic devices need equally uniform or even equally conductive material. For example, small TFTs may be much more demanding in terms of crystalline uniformity than large TFTs or even large capacitors. Also, TFTs that are used for current driving may require better uniformity than TFTs used for switching. Thus, of a total area of a particular region to be crystallized, only a fraction may need to be crystallized with a high number of laser pulses to obtain a region of high crystalline uniformity and conductivity, while the remainder may be processed with less pulses or even a single pulse. Selective area crystallization non periodic pulse ELA provides a framework for only scanning selected areas of a film, thereby reducing processing time.

Non-Periodic Pulse ELA

A non periodic ELA system includes one or more of the following features: multiple lasers or laser tubes, and means for delayed triggering of subsequent pulses to have pulses in short succession. The system also can include position controlled triggering of the pulses so that the laser beam pulses irradiate a specific position on the substrate. The timing of the two pulses spaced closely in time should be such that the irradiated portion of the film is allowed to solidify in between pulses, while the position control ensures that the irradiated region is properly located on the substrate, for example to create a column of pixel TFTs or circuits. It is further desirable for the laser beam pulse to have a top-hat beam profile with a beam width that is sufficient to have the sequence of pulses overlap a selected region.

The number of laser sources may be chosen based on various considerations such as throughput, laser power, panel size, display size, system design, and tool maintenance. A larger number of lasers will generally result in higher crystallization rates, but will also necessitate a larger number of optical elements, which may result in more complicated and costly system design. Also, a larger number of lasers may result in increased downtime of the tool because of more frequent need for service, for example tube replacement. Exemplary values for the number of lasers may be two to four or more lasers each having a power of around 600 W or more to process glass panels that may be larger than two $m^2$ and possibly as large as five or 7.5 $m^2$ to make displays having diameters as large as 30, 40, or 50 inches or more.

Non periodic pulse ELA tools can offer the following benefits over conventional ELA and/or UGS tools:

1. Efficient power delivery to preselected regions: by virtue of position control, regions in-between pixel TFTs/circuits are not needlessly crystallized. This leads to higher effective crystallization rates.
2. Elimination of beam-edge related artifacts: beam edges do not impinge on pixel TFT/circuit regions so that crystallized regions therein all experience the exact same sequence of pulses.
3. Optimizing of pulse sequence: regions are irradiated by a sequence of pulses from multiple laser sources and during a multitude of scans and as such the sequence can be optimized (e.g., pulse energy, pulse duration, pulse pre-heating).
4. Mitigating beam non-uniformities on the long axis by implementing a perpendicular displacement between scans. (Beam non-uniformities on the short axis also may be mitigated by an effective parallel displacement within or in between scans, i.e., by shifting the lateral placement of the beam with respect to the regions of interest).

Figure 2D:
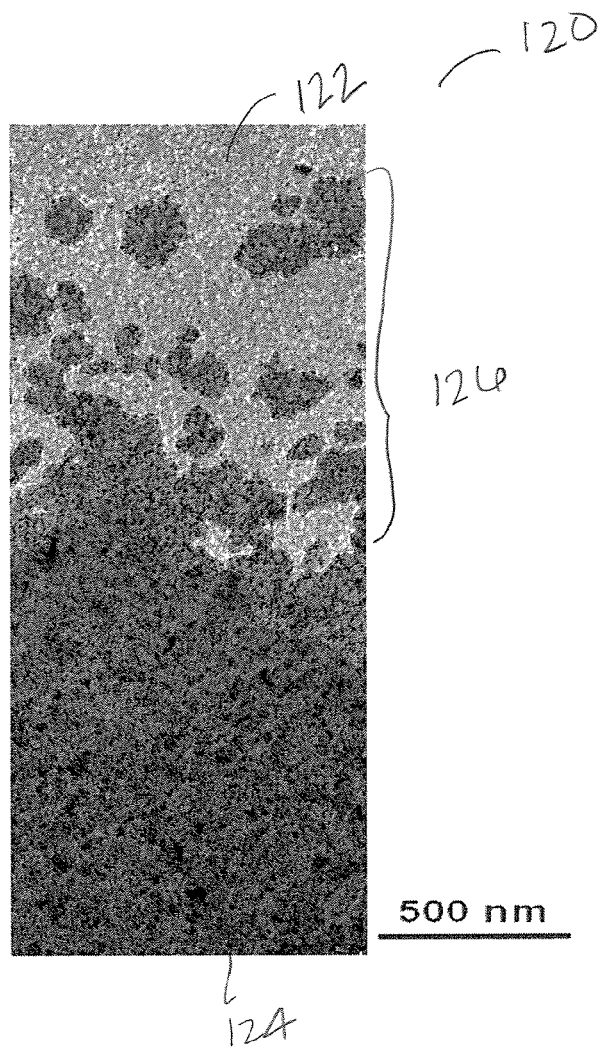
FIG. 2D depicts a single shot irradiated plasma enhanced chemical vapor deposition (PECVD) amorphous silicon film.

Multiple scans are typically required in non periodic pulse ELA to obtain satisfactory material uniformity. The SAC operation of non periodic pulse ELA typically results in higher through put rates than conventional ELA. In addition, the pulse number with non periodic pulse ELA required to obtain an acceptably uniform crystal structure may be less than that required with conventional ELA. In conventional ELA, the beam edges overlap the area of interest resulting in variation in the crystal structures of the irradiated region along the direction of the scan. The variation in crystal structure was for example discussed in Im and Kim, *Phase transformation mechanisms involved in excimer laser crystallization of amorphous silicon films*, Appl. Phys. Lett. 63, (14), Oct. 4, 1993, wherein the variation of grain size as a function of energy density in partially melted low pressure chemical vapor deposition ("LPCVD") films was discussed; LPCVD amorphous Si films are believed to contain small crystallites that trigger crystallization leading to films having a grain size that increases with energy density. In plasma enhanced chemical vapor deposition ("PECVD") films, melting and solidification processes are further complicated by the absence of such crystallites. Thus, the crystallization is preceded by formation of crystals through a nucleation process. When the nucleation density is low, this may result in disc-shaped crystal structures as is for example visible at the very edge of a single-shot, i.e., one laser pulse, irradiated PECVD amorphous Si film shown in FIG. 2D. FIG. 2D shows an edge region 120 of a single shot PECVD amorphous Si film. This edge region 120 has both an amorphous Si portion 122 and a crystalline Si portion 124. However, the transition region 126 between amorphous Si and crystalline Si is not a sharp edge, but a heterogeneous region containing a mixture of crystalline and amorphous material. The non-uniformity of the film after the first irradiation thus is impacted by the existence of grain size variation and or disc-shaped crystal structures. Such non uniformities may not easily be removed in subsequent radiations. In conventional ELA, even after as many as 10 pulses or more, the effect of the energy density gradient of the first pulse beam edge may still be visible. A large pulse number is therefore needed to erase the history of the first pulse beam edge.

As disclosed herein, SAC using non-periodic pulse ELA may require fewer pulses to achieve an equally uniformly crystallized film. As discussed in greater detail below, the energy profile across the short axis of a line beam contains leading and trailing edges of gradually changing energy density and a central flat region of relatively constant energy. The term line beam, as used herein, refers to a beam having a width substantially smaller than the length of the beam, i.e., the beam has a large aspect ratio. In conventional ELA, the beam edges are a significant source of material non-uniformity. In non periodic pulse ELA, the beam edges are positioned outside the region of interest so that the region of interest is irradiated with a top-hat portion of a first pulse. Further, the energy density of the beam can be optimized to create the most uniform starting material for the cumulative process so as to reduce the number of pulses required to reach a desired level of material uniformity.

System for Performing Non-Periodic Pulse ELA

Figure 3A:
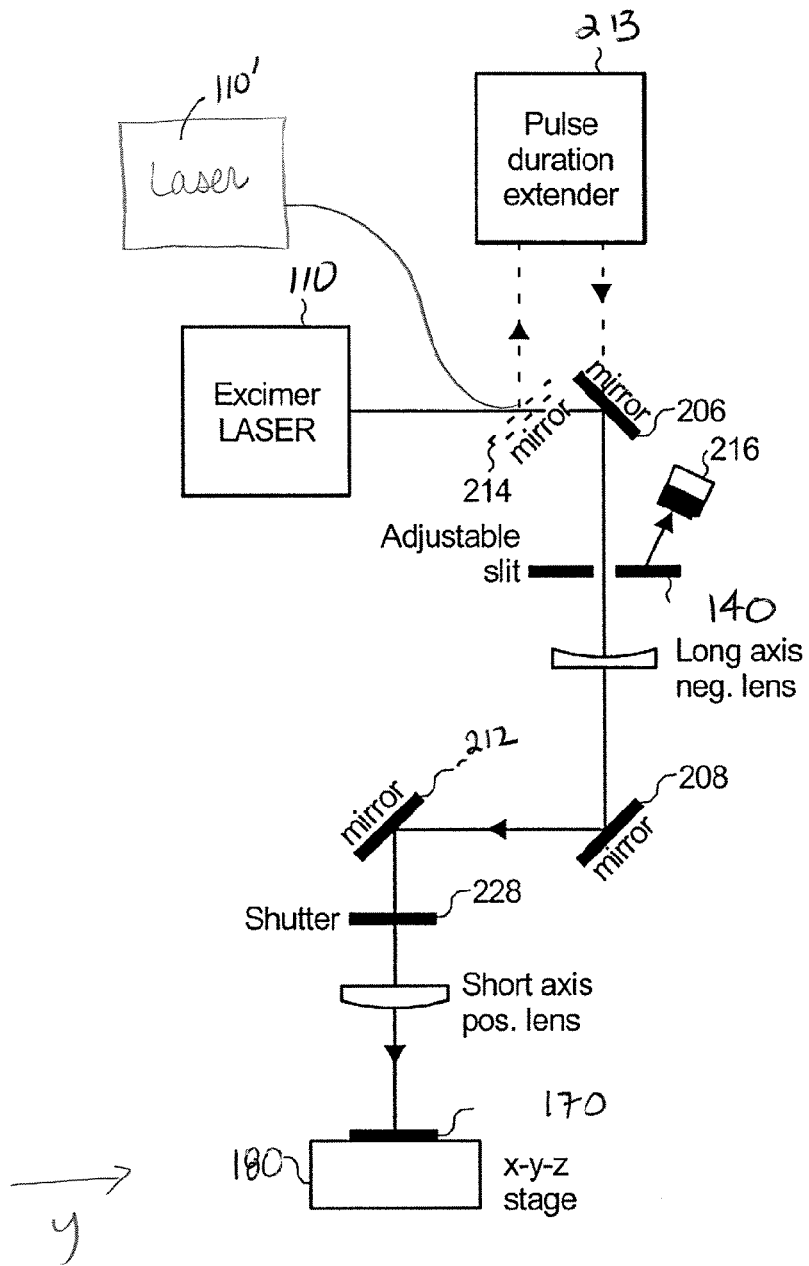
FIG. 3A depicts a non-periodic pulse ELA system, according to an embodiment of the present disclosure.

FIG. 3A depicts a non-periodic pulse ELA system. The system includes a plurality of laser pulse sources 110, 110' operating for instance at 308 nm (XeCl) or 248 nm or 351 nm. A series of mirrors 206, 208, 212 direct the laser beam to a sample stage 180, which is capable of scanning in the y-direction. The beam is shaped into a line beam having a length of for example about 360 mm, or about 470 mm, or about 720 mm, or any length that is suitable for processing a glass panel in one, two, or more scans. The system may also include a slit 140 that may be used to control the spatial profile of the laser beam and energy density meter 216 to read the reflection of slit 140. Optional shutter 228 can be used to block the beam when no sample is present or no irradiation is desired. Sample 170 may be positioned on stage 180 for processing. Further, homogenizers may be used to provide a more uniform top hat beam profile. An attenuator may be used. The beam energy is controlled by controlling the laser directly. The stage 180 can be a linear translation stage, and can have the ability to do sideways translations. Optionally, the system may include a pulse extender 213 and a mirror 214 to create extended duration pulses.

The sample translation stage 180 is preferably controlled by a computing arrangement to effectuate translations of the sample 170 in the planar y direction, as well as optionally in the x and the z directions. In this manner, the computing arrangement controls the relative position of the sample 170 with respect to the irradiation beam pulse. The repetition and the energy density of the irradiation beam pulse also are controlled by the computing arrangement. It should be understood by those skilled in the art that instead of the beam source 110, 110' (e.g., the pulsed excimer laser), the irradiation beam pulse can be generated by another known source of short energy pulses suitable for at least partially melting (and possibly fully melting throughout their entire thickness) selected areas of the semiconductor (e.g., silicon) thin film of the sample 170 in the manner described herein below. Such known sources can be a pulsed solid state laser, a chopped continuous wave laser, a pulsed electron beam and a pulsed ion beam, etc. Typically, the radiation beam pulses generated by the beam sources 110, 110' provide a beam intensity at sample level in the range of 400 mJ/cm$^2$ to 1 J/cm$^2$ or 1.5 or more, a pulse duration (FWHM) in the range of 10 to 300 nsec, and a pulse repetition rate in the range of 10 Hz to 300 Hz to 600 Hz or 1.2 kHz or more.

The exemplary system of FIG. 3A may be used to carry out the processing of the semiconductor thin film of the sample 170 in the manner described below in further detail. A mask/slit can be used by the exemplary system of the present disclosure to define the profile of the resulting masked beam pulse, and to reduce the non-uniformity of the adjacent portions and edge regions of the portions of the semiconductor thin film when these portions are irradiated by such masked beam pulse and then crystallized.

For example, a line beam for the non periodic pulse ELA process can have a width of about 100 or less to 300 microns to about 400 to 600 or more microns. The fluences of the ELA beams are selected to not induce complete melting of the film. Therefore, the ELA beam should have a fluence lower by about 5% to 30% or more of the fluence value that induces complete melting in the given film. The fluence value that induces complete melting is dependent upon the thickness of the film and the duration of the pulse. Further, the ELA beams could have relatively low repetition rates of about 300 Hz to about 600 Hz. The disclosed high power lasers provide sufficient energy per pulse to provide adequate energy density across the length of an irradiated region so that the pulse may melt a film within that region.

The ELA line beam may be created from a relatively low frequency laser source, such as used in certain systems available from JSW (The Japanese Steel Works, Ltd., located at Gate City Ohsaki-West Tower, 11-1, Osaki 1-chome, Shinagawa-ku, Tokyo, Japan). High frequency lasers, such as available from TCZ, are not well suited for the non periodic pulse ELA process as the required scan velocity, which is dictated by pulse repetition rate and the pitch of the TFTs or circuits, becomes very high.

Figure 3B:
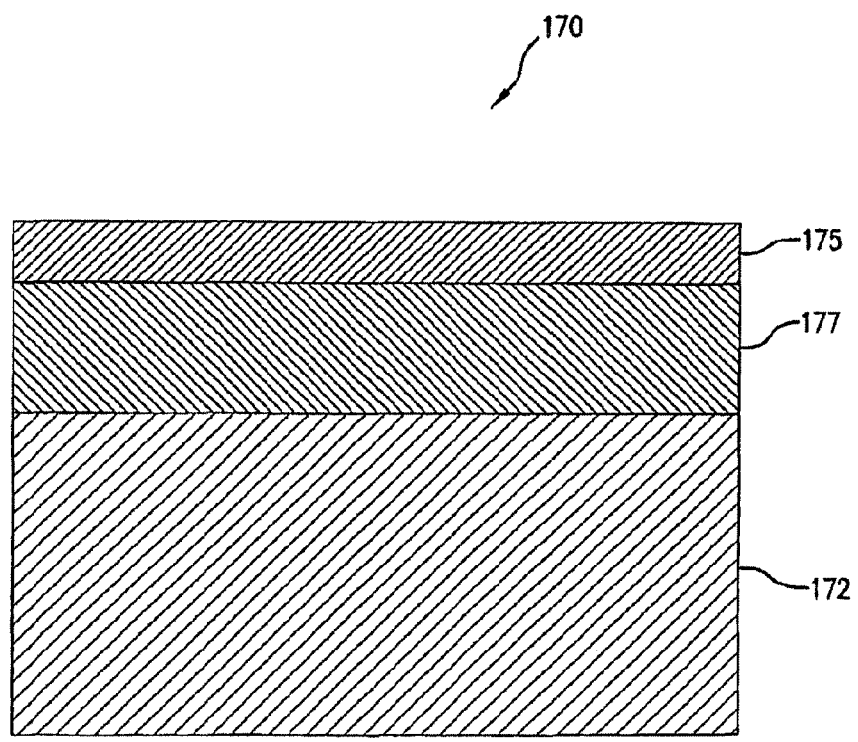
FIG. 3B depicts a sample used in the non-periodic pulse ELA system, according to an embodiment of the present disclosure.

As illustrated in FIG. 3B, a semiconductor thin film 175 of the sample 170 can be directly situated on, e.g., a glass substrate 172, and may be provided on one or more intermediate layers 177 there between. The semiconductor thin film 175 can have a thickness between 100 Å and 10,000 Å (1 micron) so long as at least certain necessary areas thereof can be at least partially or completely melted throughout their thickness.

According to an exemplary embodiment of the present disclosure, the semiconductor thin film 175 can be composed of silicon, (e.g., an amorphous silicon thin film) germanium, silicon germanium (SiGe), etc. all of which preferably have low levels of impurities. It is also possible to utilize other elements or semiconductor materials for the semiconductor thin film 175. The intermediary layer 177, which is situated immediately underneath the semiconductor thin film 175, can be composed of silicon oxide ($SiO_2$), silicon nitride ($Si_3N_4$), and/or mixtures of oxide, nitride or other materials.

Figure 4:
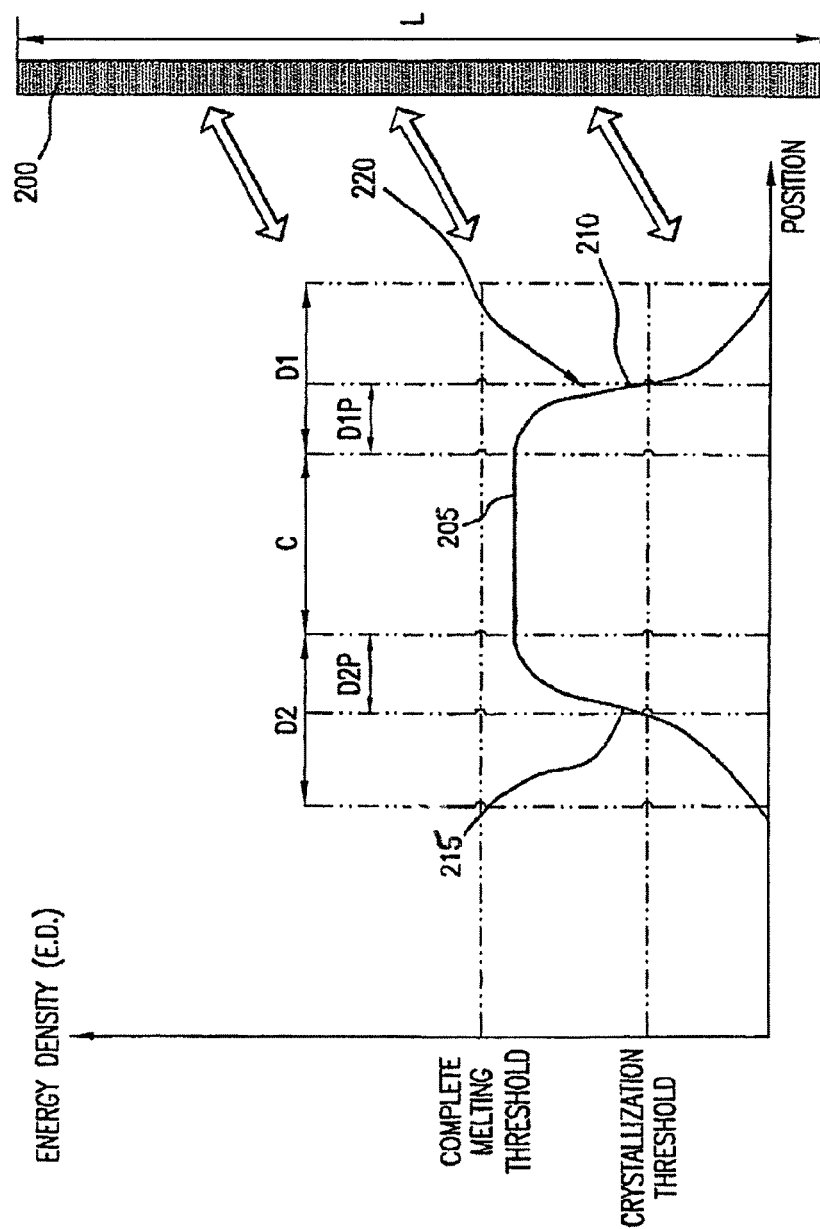
FIG. 4 illustrates an exemplary profile of the beam pulse, according to an embodiment of the present disclosure.

An exemplary profile of the beam pulse 200 is illustrated in FIG. 4, which also can be shaped by the optics of the system illustrated in FIG. 3A and/or produced by a mask. In this exemplary embodiment, the energy density of the beam pulse 200 has a profile 220 with an energy density that is below the complete melting threshold, i.e., the energy density of the beam pulse at which the film completely melts. In particular, this profile 220 includes a top portion 205, a leading edge portion 210 and a trailing edge portion 215. The top portion 205 of this embodiment extends for a width C, within which the energy density is approximately constant. The width C may be between 100 microns to 1 mm. The leading edge portion 210 can extend for a distance D1 (e.g., between 50 microns and 100 microns), and the trailing edge portion 215 may extend for a distance D2 (e.g., also between 50 µm and 100 µm). The leading edge potion 210 has a section with a length of D1P, which extends from to the point when the energy density is approximately constant to a lower point of the crystallization threshold, i.e., the energy density of the beam pulse at which the film crystallizes. Similarly, the trailing edge potion 215 has a section with a length of D2P which extends from the point of the crystallization threshold, to a higher point of when the energy density is approximately constant. The top portion 205 is commonly referred to as the "top hat" portion of the beam.

The system also can include multiple projection lenses to enable simultaneous scanning of multiple sections of a thin film. A system for allowing simultaneous scanning of multiple sections of a thin film is disclosed in U.S. Pat. No. 7,364,952, entitled "System and Method for Processing Thin Films." While the method and system have been described using a dual laser source, additional lasers may be used as well.

The non-periodic laser pulse pattern is preferably obtained by the off-set firing of a plurality of lasers of the same repetition rate. As discussed above, the lasers can be controlled by a computer system to produce the pulse energy profiles depicted in FIGS. 2B-2C. As discussed above, while in the disclosed embodiments, two laser tubes are depicted, more than two laser tubes may be used for non-periodic pulse ELA. For example, three, four, five or more laser tubes, each emitting separate laser pulses may be used to provide up to three, four, five or more irradiations onto each portion of the film during each scan.

The film 170 can be an amorphous or polycrystalline semiconductor film, for example a silicon film. The film can be a continuous film or a discontinuous film. For example, if the film is a discontinuous film, it can be a lithographically patterned film or a selectively deposited film. If the film is a selectively deposited film, it can be via a chemical vapor deposition, sputtered, or a solution processed thin film, for example ink jet printing of silicon based inks.

Non-Periodic Pulse ELA Method

Figure 5A:
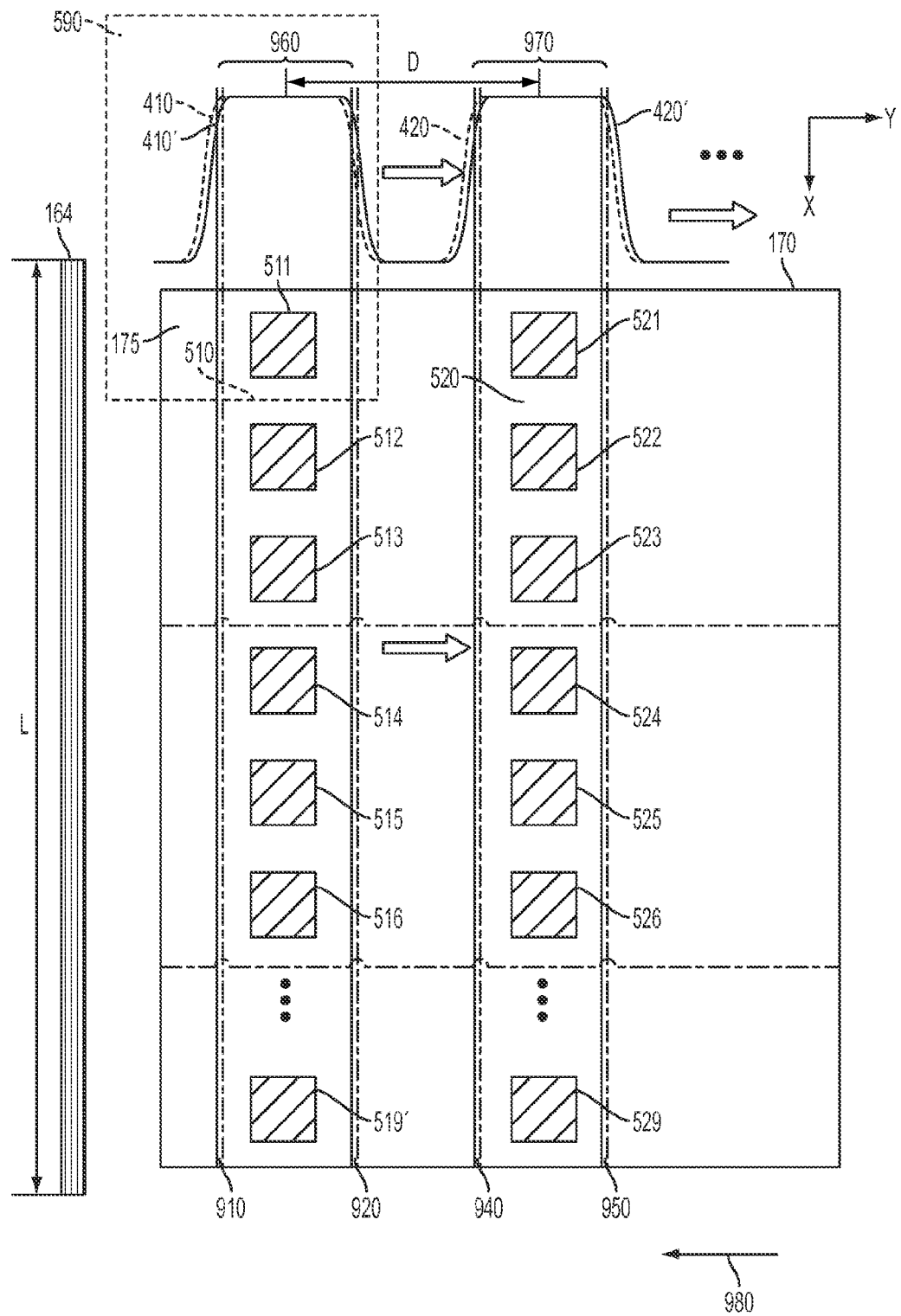
FIG. 5A depicts a non-periodic pulse ELA process, according to an embodiment of the present disclosure.

FIG. 5A depicts a non-periodic pulse ELA process. FIG. 5A shows an exemplary illustration of a film that has been irradiated by two sets of two laser pulses, in which the first two laser pulses occur close together in time, followed by a delay (during which the substrate continues to move in the −y direction as indicated by arrow 980), and the second two laser pulses also occur close together in time. The process includes at least four irradiation steps, with two irradiation steps (steps 1 and 3) corresponding to pulses from a primary laser and two irradiation steps (steps 2 and 4) corresponding to pulses from a secondary laser.

Figure 5B:
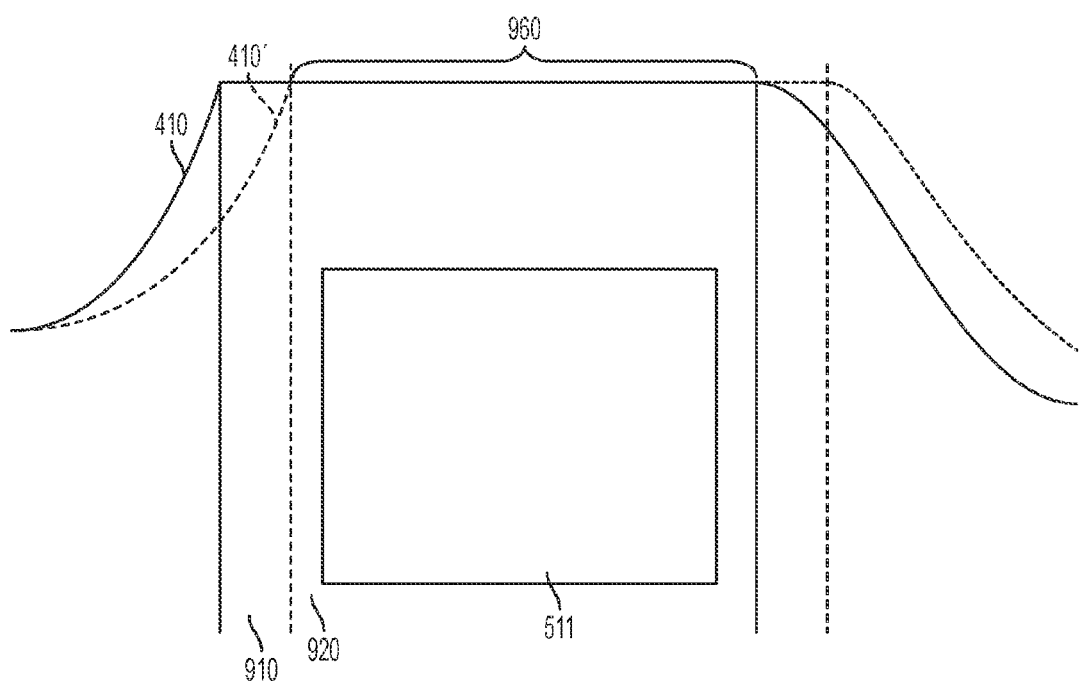
FIG. 5B is an exploded view of region 590 in FIG. 5A according to an embodiment of the present disclosure.

FIG. 5A illustrates sequential translations of the thin film 175 of the sample 170 with respect to the pulses of the line-type beam 164 shaped by the optics of the system of FIG. 3A and/or patterned by a mask. FIG. 5B is an exploded view of region 590 in FIG. 5A. In this exemplary illustration of the irradiation of the semiconductor thin film 175 provided on the sample 170, the sample 170 is translated in a negative y-direction (arrow 980) with respect to the direction of the line-type beam 164. When the sample 170 is translated in this manner to a position such that the line-type beam 164 points at a first row 510 of the thin film 175, the beam source 110 is actuated by the computing arrangement so that a first line-type beam pulse 410 from a primary laser source 110 irradiates and at least partially melts, one or more portions 511-519 at the first row 510 of the semiconductor thin film 175. The profile and length of the first line-type pulse 410 shown in FIG. 5 substantially corresponds to the profile and length of the pulse 200 illustrated in FIG. 4. It is preferable for the width C of the top hat portion 205 of the first pulse 410 to be wide enough to irradiate and partially melt the entire cross-sections of the portions 511-519 in region 910. These portions can be designated to place certain structures (e.g., TFTs) therein so that they can be used to define the pixels. The re-solidified portions which are partially melted would likely possess small grain regions, but include relatively uniform material therein. The melted portions 511-519 re-solidify and crystallize so that they have uniform crystal grain growth therein.

Second, a second line beam pulse 410 from a secondary laser source 110' irradiates the thin film 175 to induce partial melting of the thin film 175. The top hat portion of the second line beam pulse 410' irradiates a second region 920 of the thin film 175 to partially melt the entire cross sections of portions 511-519. As shown in FIG. 5, region 910 and region 920 have significant overlap and form a first crystallized region 960. In the disclosed non periodic pulse ELA process, the overlap between the first region and the second region can be greater than 70%, greater than 85%, greater than 90%, greater than 95% or greater than 99%.

After the first row 510 is irradiated and partially melted using the line-type pulses 410 and 410 as described above, the sample 170 is translated in the negative y direction (via a control of the computing arrangement so that the beam 164 impinges on a second row 520 of the semiconductor thin film 175 provided on the sample 170. As for the first row 510 and upon reaching the second row 520, the primary laser source 110 is actuated by a computing arrangement to generate a third line-type pulse 420 from the primary laser which irradiates and either at least partially or fully melts one or more sections 521-529 in region 940 of the second row 520 in substantially the same manner as described above with respect to the irradiation of the first row 510. Then, a fourth line beam pulse 420' from the secondary laser source 110' irradiates the thin film 175 to induce partial melting of the thin film 175 including sections 521-529. The top hat portion of the fourth line beam pulse 420 irradiates a fourth region 950 of the thin film 175. As shown in FIG. 5, third region 940 and fourth region 950 have significant overlap to form a second crystallized region 970. In the disclosed non periodic pulse ELA process, the overlap between the first region and the second region can be greater than 70%, greater than 85%, greater than 90%, greater than 95% or greater than 99%.

This translation of the sample 170 (so that the impingement of the line-type beam 164 moves from the first row 510 to the second row 520 of the semiconductor thin film 175) is executed for a distance D. The distance D can be also referred to a pixel row periodicity or pixel pitch because the translation of the sample 170 via the distance D is performed for other rows of the sample 170.

The translation of the sample 170 with respect to the impingement thereof by the beam 164 can be performed continuously (e.g., without stopping). The computing arrangement can control the lasers 110, 110' to generate the corresponding pulses 410, 410', 420, 420' based on a pre-defined frequency. In this manner, it is possible to define the velocity V of the continuous translation of the sample 170 with respect to the impingement of the semiconductor thin film 175 by the line-type pulses 410', 410, 420', 420 so that the respective rows 510, 520 of the thin film 175 are accurately irradiated by the pulses. For example, this velocity V of the translation of the sample 170 can be defined as follows: $V = D \times f_{laser}$ where $f_{laser}$ is the frequency of each of the lasers. Thus, if the distance D is 200 μm and the $f_{laser}$ is 300 Hz, the velocity V can be approximately 6 cm/sec, which can be a constant velocity.

While the sample 170 does not have to be continuously translated with respect to the impingement thereof by the beam 164, the actuation of a primary laser source 110 and secondary laser source 110' can be controlled based on a positional signal provided by the translation stage 180. This signal may indicate the position of the sample 170 relative to the position of the impingement thereof by the line-type beam 164. Based on the data associated with such signal, the computing arrangement can direct the actuation of the laser sources 110, 110' and the translation to the sample 170 to achieve an effective irradiation of specific portions (e.g., rows) of the semiconductor thin film 170. Thus, the location controlled irradiation of at least portions of the semiconductor thin film 175 can be achieved using a line-type beam 164.

All four irradiations partially melt the region and the molten region then quickly solidifies to form a crystallized region. The area of the thin film 175 where the first region 910 and the second region 920 overlap forms the first crystallized region 960. The area of the thin film 175 where the third region 940 and the fourth region 950 overlap forms the second crystallized region 970.

The film velocity and the repetition rate (frequency) of the first and second laser pulses determine the location of subsequent crystallized regions on the film. In one or more embodiments, the first and second crystallized regions 960 and 970 also can overlap, in which case, as the film is scanned in the y direction, the entire film surface can be crystallized.

As shown in FIG. 5A, the first and second crystallized regions 960 and 970 do not overlap. Thus, the non-periodic pulse sequence can be used to selectively crystallize only certain regions of interest, for example, the pixel TFTs or circuits 511-519 and TFTs or circuits 521-529 in an active-matrix device such as a display or a sensor array. In this SAC embodiment, there is no overlap between the first and second crystallized regions 960 and 970. Because of the lack of overlap, the stages on which the sample is held can move at higher velocity to increase the spacing between the first and second crystallized regions 960 and 970 to match the periodicity of the matrix type electronics. Such increase in stage velocity can result in a significant increase in the overall processing throughput. For example, in the pixel array of a display, the density of electronics is rather low, for example, having a pixel pitch of several hundreds of μm or more, e.g., more than 1 mm or more, a significant increase in throughput can be achieved by only crystallizing those regions. Accordingly, the stage can be moved at faster speeds for a given laser pulse rate to accomplish full crystallization of the selected areas on the film. Exemplary values for throughput for an SAC non-periodic pulse ELA system are referenced in the Examples section of this application. Thus, non-periodic pulse SAC's throughput improvement enables more competitive throughputs for large panels, e.g., Gen8 panels (~2.20× 2.50 m$^2$), such as required for large television manufacturing.

FIG. 6 depicts a similar scan to the scan shown in FIG. 5A, except that the first and third line beam pulses 1000, 1010 have a lower energy density than the second and fourth line beam pulses 1020 and 1030. This figure corresponds to the energy densities depicted in FIG. 7C. The energy densities can be range from about 20% to about 70% of the complete melting threshold. Generally, in non periodic pulse ELA, the first melting and solidification cycle can be optimized for providing the most uniform crystal structure so as to benefit the cumulative process in ELA resulting in sufficient uniformity material with low defect density. For example, the first pulse may be at an energy density higher than the complete melting threshold. Such higher energy density could for instance easily be achieved by simultaneously firing the first two pulses to result in only a single melting and solidification cycle (i.e., not distinct ones). Likewise, the first two pulses may be triggered with small delay so as to form combined pulse having longer pulse duration which may benefit the uniformity of the partially melted material even further, in particular when the starting material is a PECVD deposited a-Si film.

Figure 7:
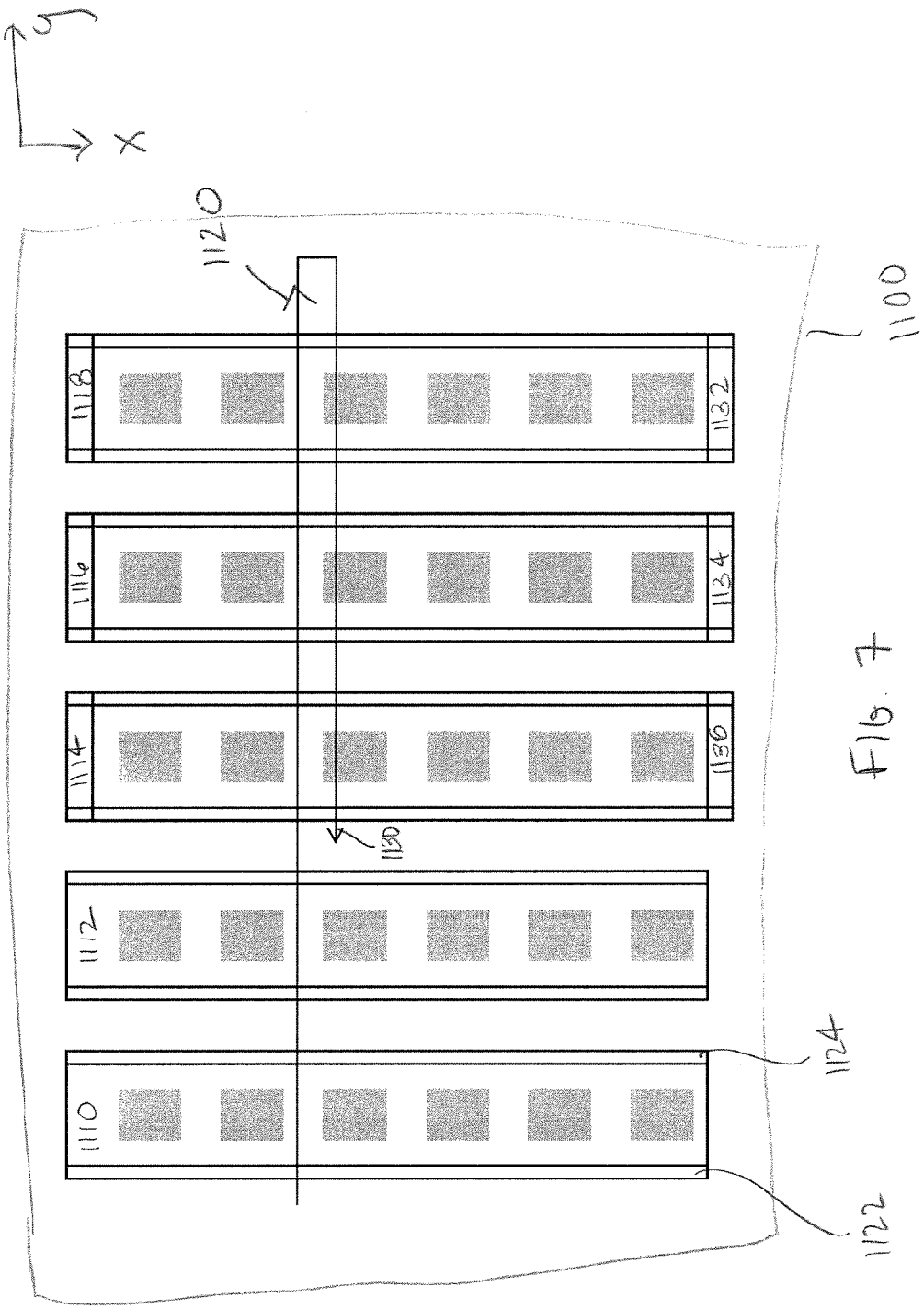
FIG. 7 depicts a first non-periodic pulse scan as described in FIG. 5A, and also includes a second scan in the reverse direction of the film, according to an embodiment of the present disclosure.
Figure 9:
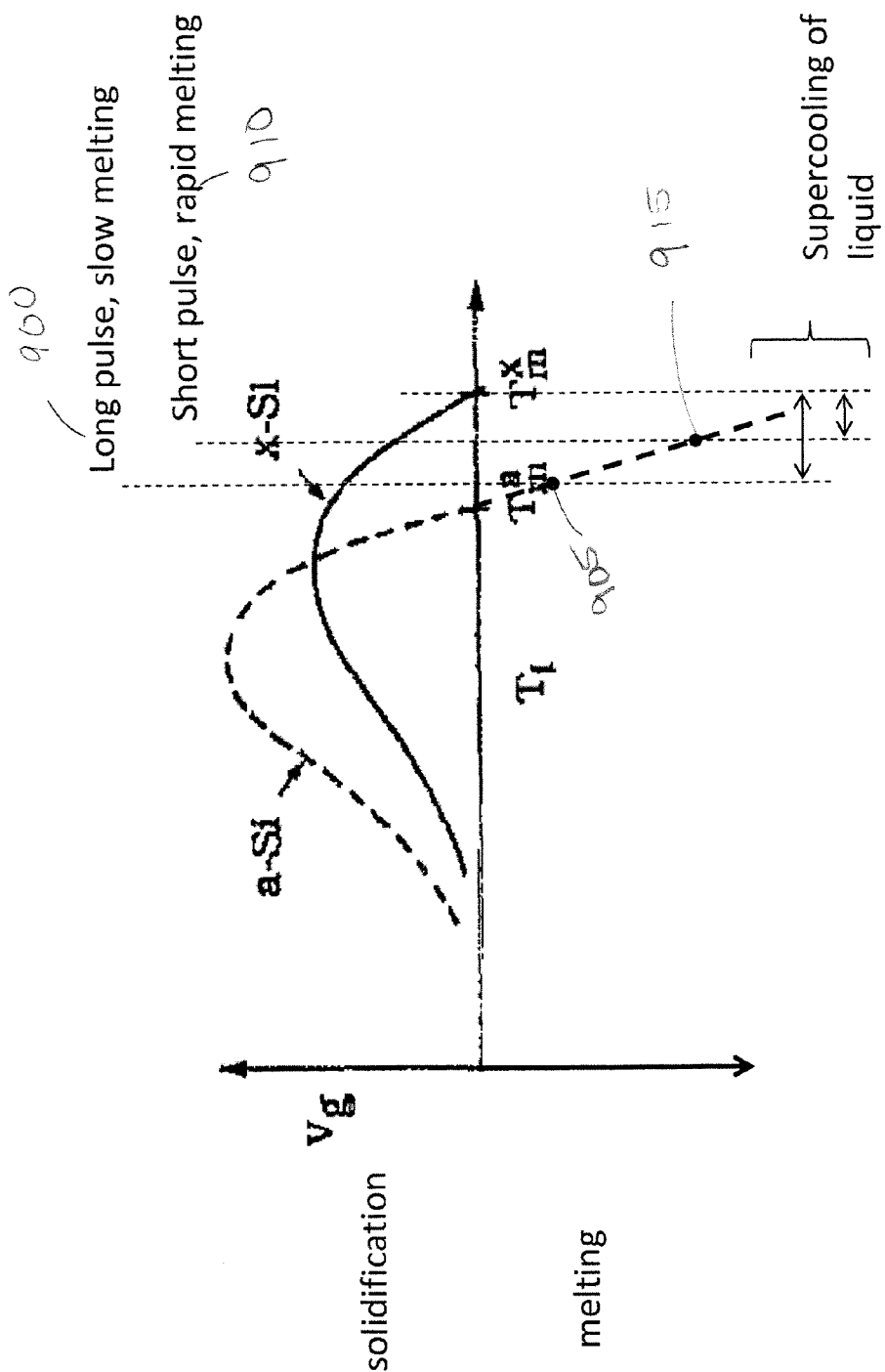

FIG. 7 depicts a first non-periodic pulse scan as described in FIG. 5A, and also includes a second scan in the reverse direction of the film 1100. In the first scan of FIG. 7, five regions 1110, 1112, 1114, 1116, and 1118 are irradiated as the scan proceeds in a first direction 1120. As discussed with respect to FIG. 5A each of the five regions 1110, 1112, 1114, 1116, and 1118 correspond to a region irradiated by a first line beam pulse 1122 and an area irradiated by a second line beam pulse 1124. Each irradiation results in partial melting and subsequent crystallization of the irradiated region. The overlapping region formed by the region irradiated by a first line beam pulse 1122 and the region irradiated by the second line beam pulse 1124 corresponds the first region 1110. After all five regions of the film have been irradiated in a first scan, the film is shifted in the positive x direction and a second scan occurs in the opposite direction as the first scan, in the direction of arrow 1130. A multiple scan conventional ELA technique is disclosed in WO 2010/056990 entitled "Systems and Methods for Crystallization of Thin Films." In some embodiments, the film is not shifted in the x direction before the scan or the film can be shifted in the negative x-direction in between the first and second scans. The second scan, as shown in FIG. 7, results in irradiated regions 1132, 1134 and 1136, etc. This multiple pass scan can provide a higher quality crystallographic film. The film can be scanned one, two, three, four, five or more times.

Thus, the non-periodic pulse ELA system can be capable of executing multiple scans to reach a desired number of pulses, e.g., a four laser tube system can be used in a five scan process to reach a total of 20 pulses per unit area of the film. The technique allows for accurate control of the pulse energy sequence for each segment of the film. For example, in non-periodic pulse ELA, the first pulse in each train of pulses during the first scan may be at a lower fluence than subsequent scans. In some embodiments, the last pulses to impinge the surface may be at a lower energy density so as to induce surface melting in order to reduce the surface roughness of ELA processed films. Further, each segment of the pixel TFTs or circuits or any part thereof may have the exact same pulse energy density sequence as the irradiation thereof with beam edges can be entirely avoided. The avoidance of beam edges to impinge the areas of interest means that the cumulative process may more rapidly converge to a material with desirable uniformity and as such, the total pulse number for such material may be reduced compared to the conventional ELA process. Thus, the benefits of the method are twofold: reduced average number of pulses as a result of selective-area crystallization and reduced number of pulses in areas of interest because of reduced initial non-uniformity of the material after the first pulse as a result of avoiding irradiation with the edges of the beam.

Compared to previously discussed ELA methods, the beam width in non-periodic pulse selective-area crystallization ELA may often be less; it need only be as wide as the width of the regions to be crystallized. Hence, surplus energy is available that can be used to increase the beam length. A longer beam length can be realized using larger dimension projection lenses. Also, the beam can be split into separate optical paths so as to simultaneously crystallize multiple regions in the film during scanning of the beam pulses. Increasing the length of the processed region upon a scan can reduce the total number of scans required to fully crystallize the film.

Additionally, selective-area crystallization non periodic pulse ELA can be used to precisely align the top hat portion of the beam such that the region of interest is not irradiated by the trailing edges of the beam. Ideally, the first irradiation of the area of interest should be with the top hat portion of the beam or at least be a portion of the line beam that is all of a similar energy density above the crystallization threshold of the film. In this way, by selectively irradiating the film such that beam edges do not irradiate the region of interest on the film, the number of scans required to create the required microstructure and uniformity within the film can be reduced.

In some embodiments, optics can be used to split the beams into two or more line beams which are each directed to another column of pixel TFTs or pixel circuits (or at least, locations where later pixel TFTs or circuits are to be fabricated). In this fashion, using a beam split into two line beams double the number of pulses per unit area can be achieved so that even fewer scans are necessary to reach complete crystallization. The multitude of parallel line beams may be used to impinge on adjacent columns of pixel TFTs/circuits or may be used to impinge on non-adjacent columns. The multitude of line beams may be generated using known ways of splitting beams and directing them on separate optical tracks. Split beams also may be rejoined to travel jointly through part of the optical path, for example through the projection lenses or even immediately after splitting. The split beams may travel parallel to each other and/or under an angle slightly offset with respect to each other. Splitting the beams while maintaining beam length would result in beams that have approximately 1/mth the width, where m is the number of line beams.

Particular parameters of the non periodic pulse ELA method depend on the beam width, which can in turn depend upon the width of the region to be crystallized. For example, the size of the active-matrix device may suggest certain pixel dimension. The pixel dimensions can give rise to new pixel layouts that take advantage of the non periodic ELA processing capabilities. For example, a 55 inch display having a 660 μm pixel pitch can require crystallized regions as wide as 300 μm. Further shrinkage of pixel dimensions (for example for ultra-high definition displays) and optimization of the design towards a layout more suitable with non periodic ELA crystallization schemes, can reduce the dimension of this region to for example below 150 μm. Optimization may further include having different layouts for pixels in two adjacent columns: TFT/circuits in adjacent columns may be placed closer to each other so that they can be overlapped within a single irradiation, after which the distance traveled to next region to be irradiated may be even larger.

Aside from pixel TFTs, TFTs also may be desirable in the periphery of the display, for example to make column and row drivers. Row drivers may need to have higher performance in order to process video signals. In some embodiments, SAC provides a sufficient area of crystallized material to integrate the desired drivers in the periphery of the display. In other embodiments, the non periodic pulse ELA can be followed by separate crystallization steps to more fully crystallize the periphery of the display. This could be done using the same laser and optical path by performing conventional scanned ELA in those regions. Alternatively, this could be done using a solid state laser shaped in a narrow line beam to perform sequential lateral solidification ("SLS") or ELA. Alternatively, a 2D projection radiation tool to perform for example 2-shot SLS (i.e., two laser pulses per unit area as shown in U.S. patent application Ser. No. 12/063,814 entitled "Systems and Methods for Uniform Sequential Lateral Solidification of Thin Films Using High Frequency Lasers," filed Oct. 31, 2008) or dot SLS (i.e., SLS using a mask having a dot pattern as shown in U.S. Pat. No. 7,645,337 entitled "Systems and Methods for Creating Crystallographic-Orientation Controlled Poly-Silicon Films," issued Jan. 12, 2010). Such could be integrated into the same tool to benefit from the precision stages. As used herein, an x-shot process refers to irradiating each targeted area of the film x times.

As described above, selective-area crystallization involves crystallizing only the regions of interest in for example a matrix-type electronic device or circuit. Thus, the locations of crystallized regions need to be aligned with respect to the locations of the nodes in the matrix-type electronic device or circuit. Accordingly, in order to implement SAC, sample alignment techniques should be implemented. The step of sample alignment may be achieved according to various techniques. In one technique, sample alignment may be established using a crystallization system that further has the ability to position the sample in such a manner that the sample position can be reproduced in further processing steps for making electronic devices. One common way is when the panel is provided with fiducials or alignment marks that are detected prior to crystallization and to which the crystallization process is aligned. Such methods of sample alignment are commonly used in lithographic procedures to make thin-film transistors where sub-micron accuracy is in overlaying various features of such devices. Sample alignment in SAC need not be as accurate as in lithography. For example, the crystallized region can be larger than the region of interest by several microns or ten or more micron on each side.

In another technique, sample alignment is established by detecting the location of crystallized regions prior to fabricating the electronic devices. The location may be achieved through detecting regions wherein electronics are to be placed. The regions can be detected because the change from amorphous to crystalline may be microscopically visible as a result to a change in optical properties.

A system for sample alignment can include an automated system for detecting fiducials and aligning the sample to a known position with respect to that fiducial. For example, the system can include a computing arrangement for controlling movement and responding to an optical detector that can detect the fiducials on the film. The optical detector can be, for example, a CCD camera.

Uniform Partial Melt Crystallization of PECVD Amorphous Si Films

As discussed above, partial melt crystallization techniques are those in which one or more irradiations are used to crystallize a silicon film wherein at least the last pulse does not induce complete melting of the film. In some embodiments, a partial melt flood irradiation method can be used to either produce a fine grained uniform crystalline film or to produce a precursor film for a non-periodic pulse irradiation method. The partial melt flood irradiation method can be a two shot partial melt process wherein an amorphous silicon film devoid of any pre-existing crystallites (e.g., a PECVD film) is transformed in two steps into a fine grained uniform crystalline film with grains having average lateral dimensions exceeding the film thickness. The partial melt flood irradiation method also can be an extended duration single shot partial melt process wherein an amorphous silicon film devoid of any pre-existing crystallites (e.g., a PECVD film) is transformed into a fine grained uniform crystalline film with grains having average lateral dimensions less than the film thickness.

The work of Professor James Im has shown that super lateral growth ("SLG") may occur in single shot irradiation processes at an energy density close to the complete melting threshold in a way that "near-complete melting" occurs (Im et al, APL 63, 1993, p 1969) resulting in lateral growth of grains having low intragrain defect density. Such material may be used to create TFTs with mobilities upwards from 100 cm$^2$/Vs. However, the TFT uniformity of this material is poor, as the grain size is very sensitive to (1) pulse energy density, (2) heterogeneities in the precursor film, and (3) if a fully amorphous film is used, the stochastic nature of the crystal nucleation process. Multiple irradiations in this SLG regime, however, can result in more uniformly sized grains. This is made possible by the formation of periodic surface roughness in the film commensurate with the wavelength of the irradiating light, resulting in a self-stabilizing process. This approach has been commercialized as ELA, most commonly using a line beam. As discussed above, the ELA process is a cumulative process wherein an initially non-uniform polycrystalline film converges to a more uniform state due to multiple radiations in the near-complete melting regime. However, the ELA process can be more efficient if the initial polycrystalline state is uniform.

As discussed above, a more uniform polycrystalline film can be obtained using a UGS system or a non periodic pulse ELA system wherein the regions of interest are not irradiated with the edges of the beam. However, even regions initially irradiated with the top hat portion of the beam can suffer from non uniformity as a result of heterogeneities in the precursor film, and, in the case of a fully amorphous film, the stochastic nature of the crystal nucleation process. The present disclosure relates to methods and systems for performing partial melt crystallization to create a uniform initial crystallized polycrystalline film that can be beneficial for increasing the efficiency of the ELA processes described above (both conventional and non-periodic pulse). In other embodiments, the obtained PMC material with enhanced uniformity may itself be used for creating thin film electronic devices without further ELA processing. This may be beneficial in situations where lower performance thin-film devices (e.g. less than 100 $cm^2/Vs$ or as low as 10 $cm^2/Vs$) are sufficient but uniformity of the film is still critical.

Partial melt crystallization (i.e., crystallization at energy densities below the near-complete melting threshold) was previously described for amorphous Si films deposited using LPCVD in Im and Kim, *Phase transformation mechanisms involved in excimer laser crystallization of amorphous silicon films*, Appl. Phys. Lett. 63, (14), Oct. 4, 1993. This study indicated that the LPCVD Si films are not fully amorphous and that small crystallites exist in the films that seed the crystallization. Because of the high density of crystallites, the lateral spacing between crystallites is extremely small and crystal growth occurs predominantly in a direction perpendicular to the plane of the film. The very small size of the grains makes this material attractive for making uniform TFTs. Such a single-shot crystallization of LPCVD films is one of what is referred to as UGS methods that are performed with flood irradiation tools that are further capable of stage-synchronized radiation of laser pulses (see U.S. Patent Application Publication No. 2006-0030164 A1, entitled "Process and system for laser crystallization processing of film regions on a substrate to minimize edge areas, and a structure of such film regions," using a two dimensional projection system and U.S. Patent Application Publication No. 2007-0010104 A1, entitled "Processes and systems for laser crystallization processing of film regions on a substrate utilizing a line-type beam, and structures of such film regions," using a line-beam ELA system). Potentially, this can be a method for making LTPS devices with a very high throughput. Such devices are currently considered for UD-LCD TV products (e.g. approximately 2000×4000 pixels, 480 Hz and 80") for which amorphous silicon is concluded to be of insufficient performance level (approximately 1 $cm^2/Vs$ for n-channel a-Si TFTs compared to up to 30 or even 50 $cm^2/Vs$ for n-channel UGS TFTs).

A PMC microstructure having very small columnar grains is by no means universally achieved in this partial melt energy density regime. Studies have shown that partial melt crystallization as is presently understood cannot be reproducibly used in manufacturing of small-grain uniform LTPS TFTs. Mariucci et al. (Thin Solid Films 427 (2003) 91-95) for example shows that very heterogeneous and partially very defective materials may be obtained (defective cores surrounded by larger and cleaner grains through lateral growth).

FIG. 8A depicts an AFM scan of the surface of a film after one irradiation at the low end of the PMC regime. It shows disc shaped structures surrounded by large protrusions indicative of lateral growth and correspondingly lateral mass flow as a result of the expansion of Si upon solidification. FIG. 8B is an illustration of the crystal structure in FIG. 8A. The crystal structure in 8B has a defective core 800. This structure is the result of a low density of nucleation events that seed lateral crystallization and result in disc shaped structures. The initial growth conditions are far from equilibrium. As such the crystals are highly defective. As growth fronts move in on each other, sufficient heat is released and leads to significant reheating of the film. The reheating can result in lower defect density lateral growth.

FIG. 8C depicts an AFM scan of the surface of a film after one irradiation at a higher energy density but still in the PMC regime. FIG. 8D is an illustration of the crystal structure in FIG. 8C. Here, the further heat introduced from higher energy density radiation results in re-melting of the defective core regions that were formed in the initial stages of phase transformation. The melt threshold of the defective core region is lower than that of the low defect density outer ring and as such will melt preferentially. Re-growth at these energy densities will be seeded from the outer ring and proceed inwards. This seeding produces a small protrusion at the center as a result of the expansion of Si upon solidification. These protrusions are visible in the AFM scan in FIG. 8C. The re-melting of defective core regions may result in films that are more uniform. FIG. 8D is an illustration of the crystal structure obtained at energy densities sufficient for near complete melting of the film. FIG. 8E shows a circular region that was formed upon lateral crystallization from an unmelted seed.

The secondary melting of defective core regions may be influenced by the temporal profile of the laser pulse. For example, excimer lasers available from Coherent, Inc. (Santa Clara, Calif.) tend to have a temporal profile that shows peaks in intensity. The first peak may lead to the initial explosive crystallization of the film, while the second peak may result in the selective re-melting of defective core regions formed during the initial stages. The temporal profile of the laser is known to be variable over time, especially with aging of the laser gas. Ultimately, over time, a third intensity peak may appear. Thus, while the material after core re-melting may be more uniform, it is not easily reproducible over many pulses from a laser tool. Other lasers may have only a single intensity peak and the details of re-melting within the same pulse will likely be different.

One way to improve reproducibility of this microstructure, is to irradiate the film twice. The first pulse can be optimized for obtaining the defective core material, while the second pulse can be optimized for re-melting and thus cleaning the core regions. This may be done using two scans or a step and irradiate procedure wherein two pulses are irradiated at each location before the stage steps to the next location.

The present disclosure relates to a system for providing such a two part irradiation partial melt crystallization process in a more efficient manner, namely, in a single scan. A non periodic pulse ELA system can be used to generate a first laser pulse of the two part process to obtain an intermediate microstructure having large grains but poor uniformity across the film, while a second pulse is used to clean the intermediate microstructure to create a final uniform film. The present method thus teaches the delayed triggering of the second pulse (and possibly the fluence control of first or second pulse) to achieve an optimized energy density window for the re-melted core regions. The delayed triggering has been suggested before, but then to mimic pulse duration extension, and without optical losses by mirrors. Because the pulses are close and may overlap, this means that the film is not completely cooled or possibly not even completely solidified upon arrival of the second pulse, resulting in a more efficient use of energy density. Further, the energy densities of the first and second pulses can be the same or can be different. However, because the film may not be completely cooled prior to arrival of the second pulse, the film may experience a different degree of melting from the second pulse as compared to the first pulse.

The starting films are typically around 40 nm to 100 nm thick or even up to 200 nm thick Si films on $SiO_2$-coated glass, quartz, or oxidized Si wafers. Thinner films are generally preferred as it reduces deposition time and it lowers the energy density needed for reaching a desired level of melting. The pulses can have pulse durations around 30 ns FWHM or more for example up to 300 ns FWHM or more. Generally, shorter pulses are more efficient in melting the Si films as less heat is lost to the underlying substrate and a higher throughput may be established. Films can be irradiated over the entire partial-melting energy-density range.

Figure 9:
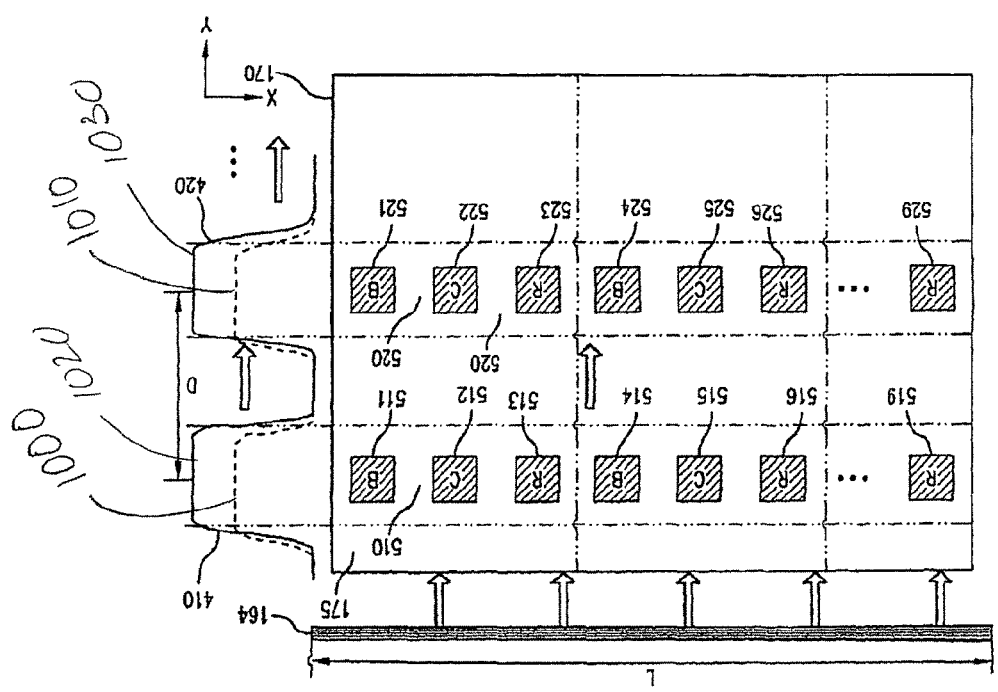
FIG. 9 depicts an interface response function of a thin film, according to an embodiment of the present disclosure.

In another embodiment the disc shaped regions are avoided altogether while using microcrystallite devoid films (as obtained using PECVD). The disc shaped regions can be avoided by increasing the nucleation density. A higher nucleation density can lead to more vertical crystallization processes resulting in less lateral growth and less lateral mass flow. Higher nucleation density can be achieved by shifting to longer pulse durations because with long pulse durations the amorphous Si melting front moves more slowly. As is made visible in the interface response function ("IRF") shown in FIG. 9, (describing the velocity of the solid-liquid interface with respect to its temperature) this means the temperature thereof is more supercooled with respect to the crystalline Si melting temperature $T^x_m$. The IRF in FIG. 9 shows temperature on the x axis and velocity of the crystal front on the y axis. The solidification region is the positive y region of the graph and the melting region is the negative y region of the graph. The dotted line corresponds to amorphous silicon while the solid line corresponds to crystalline silicon.

Thus, for a long pulse 900 having slow melting characteristics, nucleation starts rapidly and at deep supercooling conditions as indicated by point 905 on the amorphous Si IRF curve. From classical nucleation theory it is known that deep supercooling results in higher nucleation rates. Thus, a large number of nuclei are formed within in a short time and before the film starts to reheat as a result of the release of heat of fusion as those nuclei start to grow (a phenomenon referred to as recalescence). This high density of nucleation substantially eliminates lateral growth in the region because the nucleation growth will occur in the vertical direction. Substantial lateral growth can create a less homogeneous structure and an uneven film surface. Thus, by using long duration pulses, which impart less energy per unit time on the film, a film can be obtained similar to those obtained with (some) LPCVD films, wherein high densities of microcrystallites pre-exist.

With a short pulse 910, on the other hand, the melt front moves rapidly and is less supercooled. The condition schematically corresponds to 915 on the IRF. While supercooling is less than with long-pulse irradiated films, it is still sufficient for nucleation to occur, albeit at a lower rate. Hence, fewer nuclei are formed in the short time interval before significant recalescence occurs resulting in further heating of the film to temperatures where further nucleation is halted. Because of the lower density of nucleation, these types of films will experience more lateral growth and will result in heterogeneous crystal growth.

The regular excimer laser pulse can be short enough to enable the short pulse scenario, while, using the 8× pulse extender (to create an approximately 300 ns FWHM pulse), pulses can be created to be long enough to move into the long pulse scenario. Alternatively, the elongated pulse may be created using multiple laser tubes each fired in short sequence to induce a single melting and solidification cycle.

Therefore, a homogeneous crystalline film can be obtained through a single pulse partial melt process by using long pulses with slow melting characteristics. This film can be used as a precursor film for a conventional or non-periodic pulse ELA process.

Complete Melt Crystallization

In another aspect, irradiation in the complete melting regime is used to generate a fine grained uniform crystalline film or to produce an initially crystallized polycrystalline film that will benefit the subsequent cumulative ELA process. Complete melt crystallization (CMC) is a technique in which single shot irradiation is used to completely melt Si films and then the film crystallizes through nucleation (see U.S. Ser. No. 10/525,288, entitled, "Process and system for laser crystallization processing of film regions on a substrate to provide substantial uniformity, and a structure of such film regions"). CMC is one of what is referred to as UGS methods that are performed with flood irradiation tools that are further capable of stage-synchronized radiation of laser pulses (see U.S. Ser. No. 10/525,297, entitled "Process and system for laser crystallization processing of film regions on a substrate to minimize edge areas, and a structure of such film regions," using a 2D projection system and U.S. Ser. No. 11/373,772, entitled "Processes and systems for laser crystallization processing of film regions on a substrate utilizing a line-type beam, and structures of such film regions," using a line-beam ELA system).

The presently disclosed CMC method focuses on causing heterogeneous nucleation in a thin film to form low-defect small equiaxed grain Si films. The system uses high energy density pulses, for example, greater than 1.3 to 1.4 times the complete melting threshold of the film. The processing is performed in ambient air or any oxygen containing atmosphere. The process may be performed using films having an oxide surface layer or cap layer of less than about 50 nm in thickness. The system uses relatively long pulse durations, approximately 80 ns to about 500 ns (for example, 200 ns or 400 ns) in combination with a relatively thin Si film (in the range of 100 nm to 300 nm) on $SiO_2$ glass, quartz wafers. By selecting the parameters of the process to induce a certain desired heterogeneous nucleation scenario, instead of a homogenous nucleation scenario taught in the prior art, nucleation can be achieved at both the interface between the film and the oxide surface layer and the film and the substrate. As a result of the above parameters, low-defect density crystals can be formed.

The disclosed CMC method can be used for making low-performance LTPS devices with a very high throughput. Such devices are currently considered for UD-LCD TV products (e.g. approximately 2000×4000 pixels, 480 Hz, 80 inches) for which amorphous silicon is concluded to be of insufficient performance level (approximately, 1 $cm^2/Vs$ for re-channel a-Si TFTs compared to up to 30 or even 50 $cm^2/Vs$ for n-channel UGS TFTs).

Complete melting is known to result in a variety of nucleation-induced microstructures depending on the radiation conditions and sample configuration; a description of the process can be found in S. Hazair, et al, "Nucleation-Initiated Solidification of Thin Si Films," Mater. Res. Soc. Symp. Proc. Vol. 979 (2007). Many of these microstructures are characterized by a large degree of heterogeneity (variable grain sizes, highly defective regions), which will result in poor device uniformity. For example, the topic of the Hazair paper is the formation of flower-like grains (flg-Si) in which a defective core region is surrounded by a ring of low-defect-density "petal"-shaped grains.

One microstructure in particular, however, appears to be an exception to this and was first described in S. R. Stiffler, M. O. Thompson, and P. S. Peercy, Phys. Rev. Lett. 60, 2519 (1988). This microstructure consists of uniformly small grains distributed throughout the thickness of the film and with a very low intragrain defect density. Such a microstructure is expected to result in good device uniformity and possibly a reasonable device performance level. This is true even for bottom-gate TFTs because, unlike many other ways of preparing small-grain Si (including deposition techniques), the crystals at/near the bottom have low defect density and larger size. However, questions remained about the mechanisms behind formation of this microstructure and hence on the required conditions to obtain this reproducibly.

The small equiaxed grain Si (seg-Si) was described by Stiffler to be the result of homogeneous nucleation, i.e., nucleation of solids throughout the bulk of the liquid as opposed to only at interfaces. Stiffler based his conclusions on a combination of transient reflectance ("TR") data and transient conductance ("TC") data that showed a simultaneous drop in front side reflectance and the conductance of the film. This was argued to indicate nucleation throughout the bulk of the film. For twenty years this has been the accepted model to explain the presence of grains within the bulk of the film (i.e., not bordering the surface or the bottom interface). Recently, based on TR studies, it has been discovered that Stiffler's model is inaccurate.

The present TR studies instead present a model where it was postulated that seg-Si is the result of heterogeneous nucleation (i.e., at an interface) followed by volumetric recalescense, re-melting and re-solidification of defective core structures. Thus, the initial stages of this scenario are equivalent to that leading to flg-Si, with the difference being that the defective core regions re-melt and re-solidify in low-defect-density grains to form seg-Si.

For Stiffler's data, the microstructure characterization was based on top view planar SEM TEM, and AFM images. However, this was insufficient to explain all the features in the TR data. Specifically, Stiffler's model was unable to explain the drop in the back side TR ("BTR") occurring before the drop in the front side TR ("FTR") which could be observed from the experiments done in the vacuum atmosphere and with the removal of native surface $SiO_2$ layer before laser irradiation.

Presently, based on bottom view planar as well as cross sectional TEM microstructure characterization, it has been determined that such a TR drop results in the microstructure with smaller grains near the bottom area which looks like growing upward and become larger at the top of the film. On the other hand, the almost simultaneous drops of both BTR and FTR is a necessary (but not sufficient) condition for formation of the seg-Si microstructure such as it was first observed by Stiffler (and further expected to be most optimal for making uniform TFTs).

Commonly, heterogeneous nucleation is understood to take place only at the bottom interface of the film. The drop in front side TR corresponds to the onset of nucleation at the top interface (i.e., at/near the surface) of the film. Then, a simultaneous onset of nucleation on both sides of the film (as evidenced by the simultaneous drop in TR signal at both front and back side TR) results in roughly double the amount of latent heat being released back into the film and thus a much more effective/extensive re-melting/re-solidification of defective core regions. Nucleation at/near the surface requires the presence of an interface. Such an interface could for instance be with a (native) oxide. Such oxide film may be present prior to irradiation or may be formed during radiation when oxygen is present. Depending on the atmosphere it is possible that other surface reactions occur that can lead to formation of appropriate interfaces for nucleation. Furthermore, it was discovered that without such top layer (e.g., by removal of native oxide) and without the ability of formation of such top layer during radiation (e.g., by radiating under vacuum), indeed no surface nucleation occurred and no seg-Si as observed by Stiffler was formed. Finally, in some samples irradiated at relatively low energy density, a simultaneous TR signal drop was observed, yet no Stiffler seg-Si was observed. It is presently believed that this may be the result of complete re-melting of the solids formed via nucleation at the top interface. In addition, film thinner than 100 nm may also see a simultaneous TR drop, however the amount of latent heat in the volume of the film appears insufficient to result in much effective/extensive re-melting/re-solidification of defective core regions.

Figures 10A, 10B:
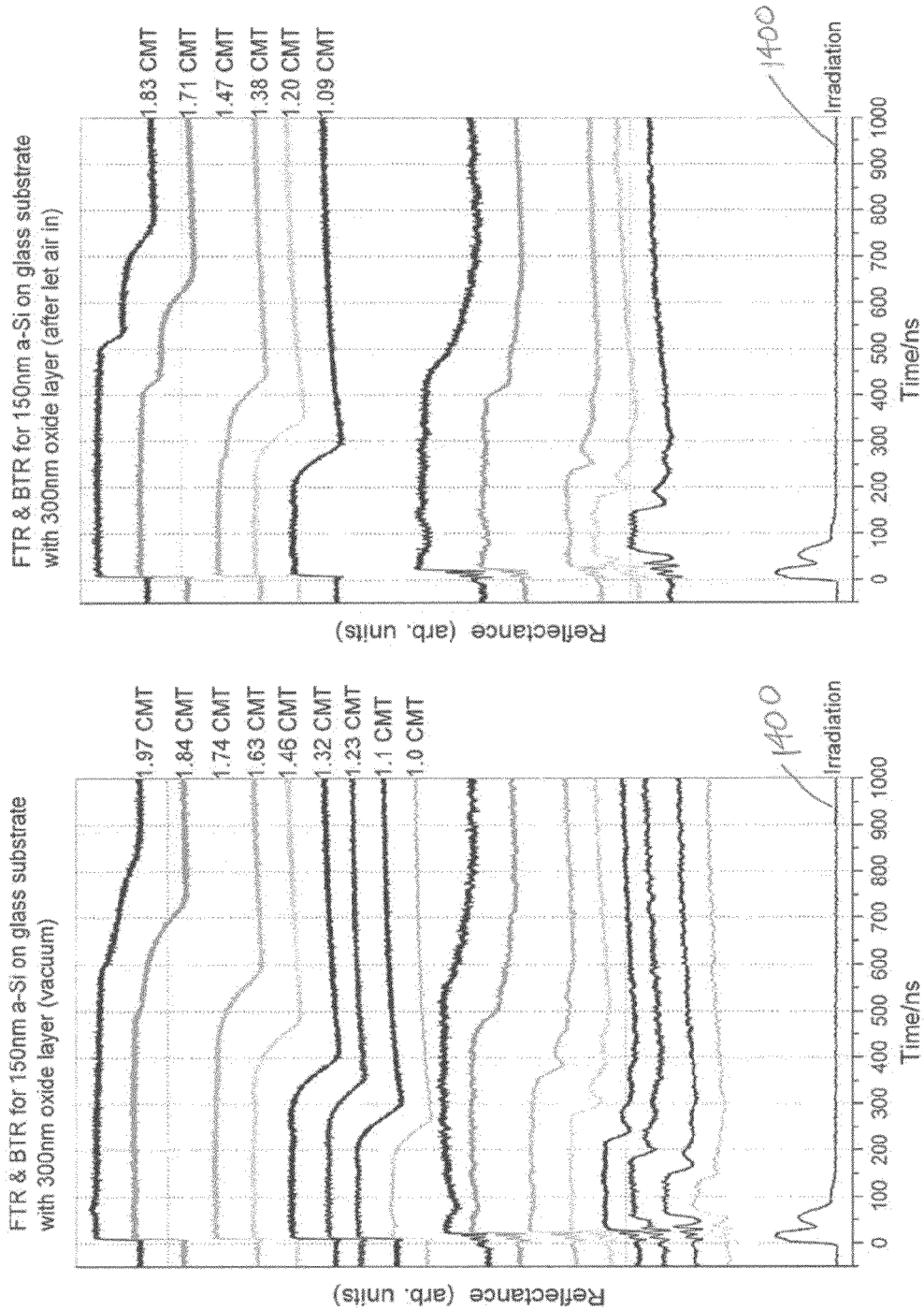
FIG. 10A depicts FTR and BTR for 150 nm a-Si on a glass substrate with a 300 nm oxide layer in vacuum, according to an embodiment of the present disclosure.
FIG. 10B is similar to 10A except 10B depicts results in vacuum, according to an embodiment of the present disclosure.

FIGS. 10A and 10B depict the results of recent TR studies. FIG. 10A depicts FTR and BTR for 150 nm a-Si on a glass substrate without surface oxide layer in vacuum. The bottom line in the graph 1400 is the irradiation experienced by the film. The lines above are reflectance values for different values of CMT. The x axis of FIG. 10A is time in nanoseconds, the y axis is a normalized value of reflectance. FIG. 10B is similar to 10A except 10B depicts results in air. FIG. 10B shows that BTR signal drops (series of signals located bottom in the graph above laser signal) before the drops in FTR under the energy density of 1.38 CMT in which FTR signal seems to start dropping simultaneously to the BTR. Thus, even in the no vacuum scenario, higher energy is required to obtain seg-Si microstructure. As shown in FIGS. 10A and 10B, because the reflectance difference between solid and liquid is so large, one can distinguish the onset of transformation from solid to liquid and vice versa from TR data. Heterogeneous nucleation can be inferred considering both FTR and BTR data and the resultant microstructure (shown in FIG. 11B). FIG. 11A depicts a graph of time in nanoseconds (x-axis) versus normalized reflectance values (y-axis) for a 200 nm a-Si film in air at 1.32 CMT 1500 and in vacuum at 1.4 CMT 1510. FIG. 11B is an image of the microstructure obtained in the air environment. FIG. 11C is an image of the microstructure obtain in the vacuum environment. As can be seen in the two figures, FIG. 11B shows larger crystals throughout the thickness 1520 of the film. FIG. 11C shows good crystal quality near the surface of the film, but poor, small crystals near the interface with the substrate 1540. Thus, it can be seen that true 3D seg-Si is obtained in air where the reaction at surface can happen to form oxide layer for heterogeneous nucleation at surface as well as at bottom interface, not in vacuum where heterogeneous nucleation can occur only at the bottom interface.

The present method is of special interest to fabrication of bottom-gate TFTs because unlike many other ways of preparing small-grain Si (including deposition techniques), the crystals at/near the bottom have low defect density and larger size. Thus, typical bottom-gate LTPS TFTs suffer from low mobility and perhaps also high leakage current. Fabrication of bottom gate TFTs requires formation of a patterned metal film (the gate) underneath the Si film and separated therefrom by an insulating layer (the gate dielectric). During laser irradiation, such a metal film will act as a heat sink and will result in a shift of the local complete melting threshold (CMT) energy density. It is found that the condition for reaching seg-Si formation stays the same provided this local shift in CMT is taken in account. For example, for a 100 nm thick metal separated from the silicon film by a 100 nm thick oxide film, the shift in complete melt threshold could typically be 15% to 20% higher. One condition for seg-Si formation is thus to irradiate at an energy density greater than 1.3 to 1.4 times the local CMT. Care must be taken that the energy density is not too high to cause damaging of the surrounding film that does not have heat sinks through agglomeration or ablation. For example, for a film of 100 nm thickness on top of 100 nm thick oxide on top of a 100 nm metallic gate, the film can be irradiated at 1.4 times the local complete melt threshold, or between approximately 1.61 and 1.68 times the complete melt threshold of the surrounding film, which is below the damaging threshold of the film.

The experimental conditions that Stiffler used are somewhat distinct from the conditions of the present process. Stiffler used a shorter laser pulse (30 ns vs. the disclosed approximately 80 ns) and also used more thermally conductive substrates: either SOI (Si film on thin 250 nm $SiO_2$ on Si substrate) or Si on sapphire. Generally, homogeneous nucleation requires very rapid quenching. The conditions of the presently disclosed process including glass substrates and longer pulses result in less rapid quenching, and thus a decreased likelihood of homogeneous nucleation and an increased likelihood of heterogeneous nucleation. The oxide thickness that Stiffler used is not enough to avoid rapid cooling. Therefore, the glass substrate gives much slower cooling than Stiffler's configuration. Thus, the present method implements useful, practical conditions in which Stiffler material may be obtained by virtue of the correct understanding of what happens.

The samples created according to embodiments of the present disclosure included 100 to 300 nm Si films on $SiO_2$-coated glass, quartz, (or also oxidized Si wafers). An excimer-laser-based system (308 nm) was used to irradiate the films at various pulse durations (30~250 n sec FWHM) and energy densities. In situ analysis was performed using front-side and backside transient reflectance measurements. Characterization of the irradiated materials was conducted using TEM. See also, Yikang "Vacuum Experiment Update: Microstructure analysis" (Sep. 2, 2009).

EXAMPLES

For large-diameter TVs, the pixel pitch may be 660 µm. With a 600 Hz laser, the scan velocity may thus be ~40 cm/s. Such a condition could be achieved using a 0.8 J pulse shaped into a 100 µm×75 cm beam for a ~640 mJ/cm² pulse assuming a 60% optical efficiency. Then, using a 4-tube laser, five overlapped scans are needed to reach complete crystallization. For a 2.2×2.5 m² panel, the crystallization time is then three parallel scans×(250 cm/40 cm/s)×5 overlapped scans=93.75 s. Taking a five second acceleration/deceleration time, a 10 second time between parallel scans, and a 60 second loading and unloading time. The total process time is then ~95+5×5+2×10+60=200 s. More conservatively, a five minute process time can be assumed. Then that equals 60/5× 24×30=~8.5 k panels/month.

A conventional 20 shot, i.e., 20 laser pulses per unit area of film, ELA process would require simultaneous triggering of the four laser tubes to get a 400 µm×75 cm beam. For 20 shots, the scan velocity would thus be 1.2 cm/s and the crystallization time would be 3×(250/1.2)=625 s. Total process time, ignoring acceleration/deceleration times, is then 625+2×10+ 60=705 s. More conservatively, a 12.5 minute process time can be assumed, and the throughput is then ~3.4 k panels/month.

While there have been shown and described examples of the present invention, it will be readily apparent to those skilled in the art that various changes and modifications may be made therein without departing from the scope of the invention. By way of example, it is appreciated that advancing a thin film in a selected direction can be accomplished by holding the laser beam stationary and moving the film relative to the laser source as well as the embodiment wherein the film is stationary and the beam is moving.

The invention claimed is:

1. A method of processing a thin film comprising:
while advancing a thin film in a first selected direction,
irradiating a first region of the thin film with a first laser pulse and a second laser pulse, each laser pulse providing a shaped beam and having a fluence that is sufficient to partially melt the thin film and the first region re-solidifying and crystallizing to form a first crystallized region; and
irradiating a second region of the thin film with a third laser pulse and a fourth laser pulse, each pulse providing a shaped beam and having a fluence that is sufficient to partially melt the thin film and the second region re-solidifying and crystallizing to form a second crystallized region,
wherein the time interval between the first laser pulse and the second laser pulse is less than half the time interval between the first laser pulse and the third laser pulse.

2. The method of claim 1, wherein the time interval between the first laser pulse and the second laser pulse is longer than a time interval for a single melting and solidification cycle of the thin film.

3. The method of claim 1, wherein each of the first laser pulse and the second laser pulse has the same energy density.

4. The method of claim 1, wherein each of the first laser pulse and the second laser pulse has a different energy density.

5. The method of claim 1, wherein each of the first laser pulse and the second laser pulse achieve the same degree of melting of the thin film.

6. The method of claim 1, wherein each of the first laser pulse and the second laser pulse achieve a different degree of melting of the thin film.

7. The method of claim 6, wherein the thin film comprises an amorphous silicon film devoid of pre-existing crystallites.

8. The method of claim 7, wherein the first laser pulse has an energy density sufficient to melt the amorphous silicon film and produce crystal structures having defective core regions.

9. The method of claim 8, wherein the second laser pulse has an energy density sufficient to re-melt the defective core regions to produce a uniform fine-grained crystalline film.

10. The method of claim 1, wherein the thin film comprises an amorphous silicon film.

11. The method of claim 1, wherein the thin film is deposited using one of low pressure chemical vapor deposition, plasma enhanced chemical vapor deposition, sputtering, and electron beam evaporation.

12. The method of claim 1, wherein the thin film comprises a processed silicon film.

13. The method of claim 12, wherein the processed silicon film is an amorphous silicon film devoid of pre-existing crystallites that has subsequently been processed according to a method comprising:

while advancing the amorphous silicon film in a second selected direction, irradiating the amorphous silicon film with an extended laser pulse having a fluence sufficient to partially melt the amorphous silicon film.

14. The method of claim 13 wherein the extended laser pulse is created by sequential overlapping of laser pulses from a multitude of laser sources wherein the delay between pulses is short enough to induce a single melting and solidification cycle.

15. The method of claim 13, wherein the amorphous silicon film is obtained via plasma-enhanced chemical vapor deposition.

16. The method of claim 13, wherein the extended laser pulse comprises a pulse length of greater than 300 ns full width half maximum.

17. The method of claim 12, wherein the processed silicon film is a silicon film that is processed according to a method comprising:

while advancing the silicon film in a second selected direction, irradiating the silicon film with a laser pulse having a fluence sufficient to completely melt the silicon film.

18. The method of claim 17, wherein the laser pulse is created by overlapping of laser pulses from a plurality of laser sources.

19. The method of claim 1, comprising while advancing the thin film in a second selected direction,
irradiating a third region of the thin film with a fifth laser pulse and a sixth laser pulse, each laser pulse providing a shaped beam and having a fluence that is sufficient to partially melt the thin film and the third region re-solidifying and crystallizing to form a third crystallized region; and irradiating a fourth region of the thin film with a seventh laser pulse and an eighth laser pulse, each pulse providing a shaped beam and having a fluence that is sufficient to partially melt the thin film and the fourth region re-solidifying and crystallizing to form a fourth crystallized region, wherein the time interval between the fifth laser pulse and the sixth laser pulse is less than half the time interval between the fifth laser pulse and the seventh laser pulse.

20. The method of claim 19, wherein the second selected direction is opposite the first selected direction and the third region overlaps the second region and the fourth region overlaps the first region.

21. The method of claim 19, wherein the second selected direction is the same as the first selected direction and wherein the third region overlaps the first region and the fourth region overlaps the second region.

22. The method of claim 19, comprising shifting the thin film in a direction perpendicular to the first selected direction prior to advancing the thin film in the second selected direction.

23. The method of claim 1, wherein each laser pulse comprises a line beam with a top portion having a uniform energy density.

24. The method of claim 1, wherein each laser pulse comprises a flood irradiation pulse.

25. A thin film processed according to the method of claim 1.

26. A device comprising a thin film processed according to the method of claim 1, wherein the device comprises a plurality of electronic circuits placed within a plurality of crystallized regions of the thin film.

27. The device of claim 26, wherein the device comprises a display device.

* * * * *